US012695437B2

(12) United States Patent
Ouchi

(10) Patent No.: US 12,695,437 B2
(45) Date of Patent: Jul. 28, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 313 days.

(21) Appl. No.: 17/983,443

(22) Filed: Nov. 9, 2022

(65) Prior Publication Data

US 2023/0084340 A1 Mar. 16, 2023

Related U.S. Application Data

(63) Continuation of application No. PCT/JP2021/021036, filed on Jun. 2, 2021.

(Continued)

(51) Int. Cl.
*H03H 9/02* (2006.01)
*H03H 9/145* (2006.01)
(Continued)

(52) U.S. Cl.
CPC .... *H03H 9/02574* (2013.01); *H03H 9/02559* (2013.01); *H03H 9/02992* (2013.01);
(Continued)

(58) Field of Classification Search
CPC ........... H03H 9/02574; H03H 9/02559; H03H 9/02992; H03H 9/145; H03H 9/25;
(Continued)

(56) References Cited

U.S. PATENT DOCUMENTS

| 6,445,265 | B1 | 9/2002 | Wright |
| 6,771,145 | B2 * | 8/2004 | Ouchi ................. H03H 9/0085 |
| | | | 333/195 |

(Continued)

FOREIGN PATENT DOCUMENTS

| CA | 3106887 A1 * | 1/2020 | ......... H03H 9/02669 |
| JP | H10126208 A | 5/1998 | |

(Continued)

OTHER PUBLICATIONS

International Search Report in PCT/JP2021/021036, mailed Aug. 10, 2021, 4 pages.

(Continued)

*Primary Examiner* — Samuel S Outten
(74) *Attorney, Agent, or Firm* — Keating & Bennett, LLP

(57) ABSTRACT

An acoustic wave device includes a support including a cavity, a piezoelectric layer on or above the support and made of one of lithium niobate or lithium tantalate, an interdigital transducer electrode embedded in the piezoelectric layer and including surfaces opposed to each other in a thickness direction, one of the surfaces being in contact with the piezoelectric layer, and a dielectric film on the piezoelectric layer and covering the interdigital transducer electrode. The interdigital transducer electrode includes electrode fingers, at least one of which overlaps the cavity in plan view. Assuming a thickness of the piezoelectric layer is d and an electrode finger pitch of the interdigital transducer electrode is p, p/d≥about 4.25.

20 Claims, 13 Drawing Sheets

Related U.S. Application Data

(60) Provisional application No. 63/034,473, filed on Jun. 4, 2020.

(51) Int. Cl.
 *H03H 9/25* (2006.01)
 *H03H 9/64* (2006.01)

(52) U.S. Cl.
 CPC .............. *H03H 9/145* (2013.01); *H03H 9/25* (2013.01); *H03H 9/6483* (2013.01)

(58) Field of Classification Search
 CPC .. H03H 9/6483; H03H 9/02015; H03H 9/173; H03H 9/174; H03H 9/175; H03H 9/02228
 See application file for complete search history.

(56) References Cited

U.S. PATENT DOCUMENTS

| | | | | | |
|---|---|---|---|---|---|
| 6,781,478 | B2 * | 8/2004 | Takamine | ............ | H03H 9/0057 333/195 |
| 6,781,485 | B2 * | 8/2004 | Takamine | ............ | H03H 9/0061 333/195 |
| 6,809,614 | B2 * | 10/2004 | Fujii | .................... | H03H 9/0085 333/195 |
| 6,876,275 | B2 * | 4/2005 | Ouchi | .................. | H03H 9/0071 333/195 |
| 7,034,639 | B2 * | 4/2006 | Takamine | ............ | H03H 9/0061 333/195 |
| 7,439,827 | B2 * | 10/2008 | Ouchi | .................. | H03H 9/0057 333/195 |
| 7,471,027 | B2 * | 12/2008 | Kando | ................. | H03H 9/0222 310/313 R |
| 7,482,895 | B2 * | 1/2009 | Igaki | .................... | H03H 9/0274 333/195 |
| 7,573,178 | B2 * | 8/2009 | Inoue | ................. | H03H 9/02574 310/313 R |
| 7,737,603 | B2 * | 6/2010 | Kando | ............... | H03H 9/14538 310/313 R |
| 7,746,199 | B2 * | 6/2010 | Ouchi | .................. | H03H 9/6433 333/195 |
| 7,915,976 | B2 * | 3/2011 | Tanaka | ................. | H03H 9/1452 310/313 C |
| 8,188,812 | B2 * | 5/2012 | Tanaka | ................. | H03H 9/0085 333/133 |
| 8,279,021 | B2 * | 10/2012 | Hara | ...................... | H03H 9/605 333/133 |
| 8,610,518 | B1 * | 12/2013 | Solal | .................... | H03H 9/0066 333/195 |
| 9,118,297 | B2 * | 8/2015 | Ouchi | .................. | H03H 9/6436 |
| 9,247,351 | B2 * | 1/2016 | Detlefsen | .............. | H04R 17/00 |
| 9,712,139 | B2 * | 7/2017 | Taniguchi | ........... | H03H 9/6426 |
| 9,860,006 | B1 * | 1/2018 | Okuda | ................. | H03H 9/6436 |
| 10,171,061 | B2 * | 1/2019 | Iwamoto | ............. | H03H 9/1457 |
| 10,425,060 | B2 * | 9/2019 | Nakamura | .............. | H03H 9/64 |
| 10,469,055 | B2 * | 11/2019 | Iwamoto | ........... | H03H 9/02031 |
| 10,476,469 | B2 * | 11/2019 | Gong | ................. | H03H 9/02259 |
| 10,491,192 | B1 | 11/2019 | Plesski et al. | | |
| 10,530,336 | B2 * | 1/2020 | Takamine | .......... | H03H 9/02574 |
| 10,601,570 | B2 * | 3/2020 | Takamine | ............... | H04L 25/00 |
| 10,637,432 | B2 * | 4/2020 | Kai | .......................... | H03H 9/25 |
| 10,651,822 | B2 * | 5/2020 | Takamine | ........... | H03H 9/6483 |
| 2011/0316647 | A1 * | 12/2011 | Ouchi | .................. | H03H 9/0071 333/195 |
| 2012/0286900 | A1 | 11/2012 | Kadota et al. | | |
| 2013/0106535 | A1 | 5/2013 | Abbott et al. | | |
| 2019/0074813 | A1 * | 3/2019 | Zou | ........................ | H03H 9/562 |
| 2019/0097602 | A1 | 3/2019 | Kimura | | |
| 2019/0123710 | A1 * | 4/2019 | Plesski | .............. | H03H 9/02574 |
| 2019/0199320 | A1 * | 6/2019 | Morita | ................ | H03H 9/6489 |
| 2019/0372551 | A1 * | 12/2019 | Daimon | ............. | H03H 9/145 |
| 2019/0386635 | A1 * | 12/2019 | Plesski | ............... | H03H 9/02062 |
| 2020/0295730 | A1 | 9/2020 | Nagatomo et al. | | |
| 2021/0408999 | A1 | 12/2021 | Ito | | |
| 2022/0337220 | A1 * | 10/2022 | Ballandras | ............... | H03H 3/02 |

FOREIGN PATENT DOCUMENTS

| | | | | |
|---|---|---|---|---|
| JP | 2002534886 | A | | 10/2002 |
| JP | 2012189335 | A | | 10/2012 |
| JP | 2013090023 | A * | 5/2013 | |
| JP | 2013093852 | A | | 5/2013 |
| JP | 2019062441 | A | | 4/2019 |
| JP | 2019097155 | A * | 6/2019 | ......... H01L 41/0805 |
| WO | 2011093449 | A1 | | 8/2011 |
| WO | 2019111664 | A1 | | 6/2019 |
| WO | 2020095586 | A1 | | 5/2020 |

OTHER PUBLICATIONS

Written Opinion in PCT/JP2021/021036, mailed Aug. 10, 2021, 4 pages.

\* cited by examiner

ACOUSTIC WAVE DEVICE

CROSS REFERENCE TO RELATED APPLICATIONS

This application claims the benefit of priority to Provisional Application No. 63/034,473 filed on Jun. 4, 2020 and is a Continuation Application of PCT Application No. PCT/JP2021/021036 filed on Jun. 2, 2021. The entire contents of each application are hereby incorporated herein by reference.

BACKGROUND OF THE INVENTION

1. Field of the Invention

The present invention relates to an acoustic wave device.

2. Description of the Related Art

Hitherto, acoustic wave devices have been widely used in filters and the like of cellular phones. In recent years, an acoustic wave device using bulk waves in a thickness-shear mode as described in U.S. Pat. No. 10,491,192 has been suggested. In this acoustic wave device, paired electrodes are provided on a piezoelectric layer. The paired electrodes are opposed to each other on the piezoelectric layer and are respectively connected to different potentials. Bulk waves in the thickness-shear mode are excited by applying an alternating-current voltage between the electrodes.

When bulk waves in the thickness-shear mode are used, the pitch of electrode fingers tends to increase, and the duty tends to decrease. For this reason, it is difficult to increase the capacitance. Thus, when a desired capacitance is obtained, it is difficult to reduce the size of the acoustic wave device.

SUMMARY OF THE INVENTION

Preferred embodiments of the present invention provide acoustic wave devices that are each able to increase a capacitance and facilitate a size reduction.

A preferred embodiment of the present invention provides an acoustic wave device. The acoustic wave device includes a support including a cavity, a piezoelectric layer on or above the support and made of one of lithium niobate or lithium tantalate, an interdigital transducer electrode embedded in the piezoelectric layer and including surfaces opposed to each other in a thickness direction, one of the surfaces being in contact with the piezoelectric layer, and a dielectric film on the piezoelectric layer and covering the interdigital transducer electrode. The interdigital transducer electrode includes a plurality of electrode fingers. At least one of the plurality of electrode fingers overlaps the cavity in plan view. Assuming a thickness of the piezoelectric layer is d and an electrode finger pitch of the interdigital transducer electrode is p, p/d≥about 4.25.

A preferred embodiment of the present invention provides an acoustic wave device. The acoustic wave device includes a support, a piezoelectric layer on or above the support and made of one of lithium niobate or lithium tantalate, an interdigital transducer electrode embedded in the piezoelectric layer and including surfaces opposed to each other in a thickness direction, one of the surfaces being in contact with the piezoelectric layer, and a dielectric film on the piezoelectric layer and covering the interdigital transducer electrode. The piezoelectric layer includes a cavity. The interdigital transducer electrode includes a plurality of electrode fingers. At least one of the plurality of electrode fingers overlaps the cavity in plan view. Assuming a thickness of the piezoelectric layer is d and an electrode finger pitch of the interdigital transducer electrode is p, p/d≥about 4.25.

Another preferred embodiment of the present invention provides a ladder filter. The ladder filter includes a series arm resonator and a parallel arm resonator. The parallel arm resonator is an acoustic wave device according to a preferred embodiment of the present invention.

A further preferred embodiment of the present invention provides a ladder filter. The ladder filter includes a series arm resonator and a parallel arm resonator. The series arm resonator and the parallel arm resonator are each an acoustic wave device according to a preferred embodiment of the present invention. An electrode finger pitch of the interdigital transducer electrode in the series arm resonator is the same or substantially the same as an electrode finger pitch of the interdigital transducer electrode in the parallel arm resonator.

According to preferred embodiments of the present invention, it is possible to provide acoustic wave devices that are each able to increase a capacitance and facilitate a size reduction.

The above and other elements, features, steps, characteristics and advantages of the present invention will become more apparent from the following detailed description of the preferred embodiments with reference to the attached drawings.

DETAILED DESCRIPTION OF THE
PREFERRED EMBODIMENTS

Hereinafter, the present invention will be clarified by describing specific preferred embodiments of the present invention with reference to the drawings.

Each of the preferred embodiments described in the specification is illustrative and partial replacements or combinations of components are possible among different preferred embodiments.

Figure 1:
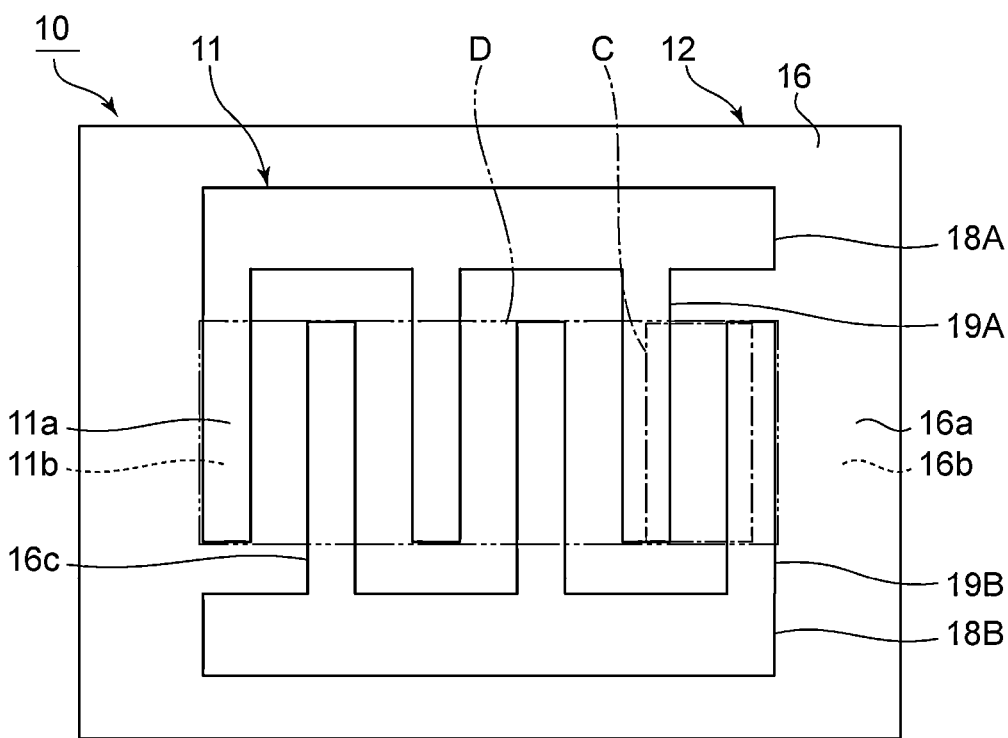
FIG. 1 is a plan view of an acoustic wave device according to a first preferred embodiment of the present invention.
Figure 2:
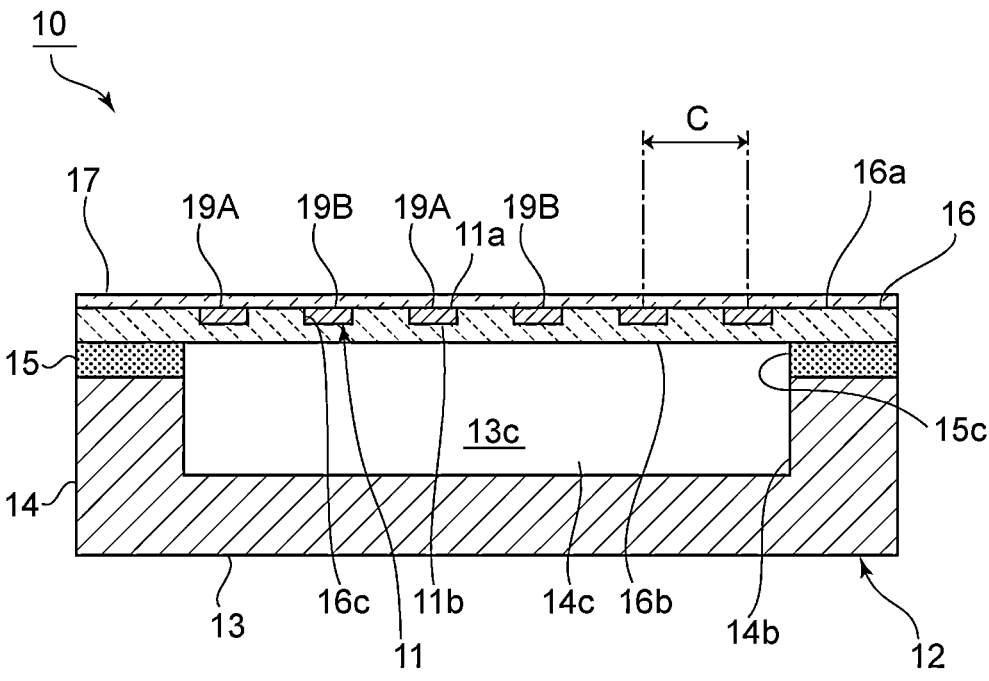
FIG. 2 is an elevational cross-sectional view of the acoustic wave device according to the first preferred embodiment of the present invention.

FIG. 1 is a plan view of an acoustic wave device according to a first preferred embodiment of the present invention. FIG. 2 is an elevational cross-sectional view of the acoustic wave device according to the first preferred embodiment. In FIG. 1, a dielectric film (described later) is omitted.

As shown in FIGS. 1 and 2, an acoustic wave device 10 includes a piezoelectric substrate 12, an interdigital transducer electrode 11, and a dielectric film 17. As shown in FIG. 2, the piezoelectric substrate 12 includes a support 13 and a piezoelectric layer 16. In the present preferred embodiment, the support 13 includes a support substrate 14 and an electrically insulating layer 15. In the piezoelectric substrate 12, the electrically insulating layer 15 is provided on the support substrate 14. The piezoelectric layer 16 is provided on the electrically insulating layer 15.

The piezoelectric layer 16 includes a first principal surface 16a and a second principal surface 16b. The first principal surface 16a and the second principal surface 16b are opposed to each other. Of the first principal surface 16a and the second principal surface 16b, the second principal surface 16b is located on the support 13 side.

The interdigital transducer electrode 11 is embedded in the piezoelectric layer 16. More specifically, the interdigital transducer electrode 11 is embedded on the first principal surface 16a side of the piezoelectric layer 16. A recessed portion 16c having the same or substantially the same shape as the interdigital transducer electrode 11 is provided on the first principal surface 16a in plan view. The interdigital transducer electrode 11 is provided in the recessed portion 16c.

The interdigital transducer electrode 11 includes a first surface 11a and a second surface 11b. The first surface 11a and the second surface 11b are opposed to each other in a thickness direction. The second surface 11b is in contact with the bottom surface of the recessed portion 16c. In the present preferred embodiment, a portion of the first principal surface 16a of the piezoelectric layer 16 where the recessed portion 16c is not provided is flush with the first surface 11a of the interdigital transducer electrode 11. The position of the first surface 11a is not limited thereto.

The dielectric film 17 is provided on the piezoelectric layer 16 so as to cover the interdigital transducer electrode 11.

The support substrate 14 includes a recessed portion 14c and a support portion 14b. The support portion 14b surrounds the recessed portion 14c. The electrically insulating layer 15 is provided on the support portion 14b. The electrically insulating layer 15 has a frame shape. The electrically insulating layer 15 includes a through-hole 15c. A cavity 13c of the support 13 is defined by the recessed portion 14c of the support substrate 14 and the through-hole 15c of the electrically insulating layer 15. The piezoelectric layer 16 covers the cavity 13c of the support 13. In other words, the piezoelectric layer 16 closes the cavity 13c of the support 13. In the present preferred embodiment, the cavity 13c is a hollow portion. The cavity 13c may be a through-hole provided in the support 13. The cavity 13c does not need to be provided in the support 13. The cavity 13c may be provided in the piezoelectric layer 16. The cavity of the piezoelectric layer 16 may be, for example, a recessed portion provided on the second principal surface 16b of the piezoelectric layer 16 on the support 13 side. The piezoelectric layer 16 just needs to include a portion directly provided on the support 13 and a portion provided on the support 13 via the cavity.

The interdigital transducer electrode 11 includes a first busbar 18A and a second busbar 18B, and a plurality of first electrode fingers 19A and a plurality of second electrode fingers 19B. The first busbar 18A and the second busbar 18B are opposed to each other. One ends of the plurality of first electrode fingers 19A each are connected to the first busbar 18A. One ends of the plurality of second electrode fingers 19B each are connected to the second busbar 18B. The plurality of first electrode fingers 19A and the plurality of second electrode fingers 19B are interdigitated with each other. Hereinafter, the first electrode fingers 19A and the second electrode fingers 19B may be simply referred to as electrode fingers.

Acoustic waves are excited by applying an alternating-current voltage to the interdigital transducer electrode 11. The acoustic wave device 10 uses, for example, bulk waves in a thickness-shear mode, such as a first thickness-shear mode. In the present preferred embodiment, where the thickness of the piezoelectric layer is d and the electrode finger pitch of the interdigital transducer electrode 11 is p, p/d≥about 2, for example. In other words, d/p≤about 0.5, for example. Thus, it is possible to suitably excite bulk waves in the thickness-shear mode.

As shown in FIG. 1, the first electrode fingers 19A and the second electrode fingers 19B are opposed to each other in a direction orthogonal or substantially orthogonal to the first principal surface 16a and the second principal surface 16b when viewed in plan. A plan view means that the acoustic wave device 10 is viewed in a direction perpendicular or substantially perpendicular to the first principal surface 16a and the second principal surface 16b. Here, in plan view, a direction in which the first electrode fingers 19A and the second electrode fingers 19B are opposed to each other is defined as electrode finger opposed direction. When viewed in the electrode finger opposed direction, a region in which adjacent electrode fingers overlap is an overlapping region D. The overlapping region D is a region from the electrode finger of the interdigital transducer electrode 11 on one-side end to the electrode finger on the other-side end in the electrode finger opposed direction. More specifically, the overlapping region D includes a region from an outer-side end edge of the electrode finger on the one-side end in the electrode finger opposed direction to an outer-side end edge of the electrode finger on the other-side end in the electrode finger opposed direction. At least one of the plurality of first electrode fingers 19A and at least one of the plurality of second electrode fingers 19B are provided at a location that overlaps the cavity 13c in plan view.

In addition, the acoustic wave device 10 includes a plurality of excitation regions C. The excitation regions C are also regions where adjacent electrode fingers overlap each other when viewed in the electrode finger opposed direction. Each of the excitation regions C is a region between a pair of electrode fingers. More specifically, each excitation region C is a region from the center of one electrode finger in the electrode finger opposed direction to the center of the other electrode finger in the electrode finger opposed direction. Thus, the overlapping region D includes the plurality of excitation regions C. Bulk waves in the thickness-shear mode are excited in each excitation region C.

Some of the unique features of the present preferred embodiment are that the interdigital transducer electrode 11 is embedded in the piezoelectric layer 16, the second surface 11b of the interdigital transducer electrode 11 is in contact with the piezoelectric layer 16, and the dielectric film 17 is provided on the piezoelectric layer 16 so as to cover the interdigital transducer electrode 11. Thus, it is possible to increase the capacitance and to facilitate a reduction in size. This will be described below.

The interdigital transducer electrode 11 is embedded in the piezoelectric layer 16. Therefore, a portion of the piezo-electric layer 16 is disposed between each of the first electrode fingers 19A and a corresponding one of the second electrode fingers 19B. The relative dielectric constant of the piezoelectric layer 16 is higher than the relative dielectric constant of air or the like. Thus, it is possible to increase the capacitance without increasing the size of the acoustic wave device 10. Therefore, it is possible to facilitate a reduction in the size of the acoustic wave device 10. In addition, in the present preferred embodiment, it is possible to easily adjust the frequency not by adjusting the electrode finger pitch but by adjusting the thickness of the dielectric film 17. Since the electrode finger pitch does not need to be increased at the time of decreasing the frequency, it is possible to further facilitate a reduction in size.

The piezoelectric layer 16 is made of, for example, lithium niobate in the present preferred embodiment. More specifically, the piezoelectric layer 16 is, for example, a Z-cut LiNbO$_3$ layer. The material and cut angle of the piezoelectric layer 16 are not limited thereto. The piezoelectric layer 16 may be, for example, a lithium tantalate layer, such as LiTaO$_3$ layer.

The interdigital transducer electrode 11 is made of, for example, Al in the present preferred embodiment. In the specification, a state where one member is made of one material includes a case where a member includes a small amount of impurities to such an extent that the electrical characteristics of an acoustic wave device do not deteriorate. The material of the interdigital transducer electrode is not limited to Al. The interdigital transducer electrode may be defined by a multilayer metal film.

The dielectric film 17 is, for example, an SiO$_2$ film in the present preferred embodiment. The material of the dielectric film 17 is not limited thereto and may be, for example, a silicon oxide having a composition ratio other than SiO$_2$, a silicon nitride, or the like.

The electrically insulating layer 15 is, for example, an SiO$_2$ film in the present preferred embodiment. The material of the electrically insulating layer 15 is not limited thereto and may be, for example, a silicon oxide having a composition ratio other than SiO$_2$, a silicon nitride, a tantalum oxide, or the like. The electrically insulating layer 15 does not necessarily need to be provided. The support 13 may include only the support substrate 14. In this case, a recessed portion 13a of the support 13 is a recessed portion provided only in the support substrate 14. When the electrically insulating layer 15 is provided, the recessed portion 13a may include only a recessed portion or a through-hole provided in the electrically insulating layer 15, or a recessed portion may be provided in the support substrate 14.

The support substrate 14 is, for example, a silicon substrate in the present preferred embodiment. The material of the support substrate 14 is not limited thereto. Examples of the material of the support substrate 14 include a piezoelectric body, such as aluminum oxide, lithium tantalate, lithium niobate, and quartz crystal, various ceramics, such as alumina, sapphire, silicon nitride, aluminum nitride, silicon carbide, zirconia, cordierite, mullite, steatite, and forsterite, a dielectric, such as diamond and glass, a semiconductor, such as gallium nitride, and a resin.

As described above, in the present preferred embodiment, where the thickness of the piezoelectric layer 16 is d and the electrode finger pitch of the interdigital transducer electrode 11 is p, p/d≥about 2, for example. The range of p/d is preferably about 5.75≤p/d≤about 6.5, for example. Thus, it is possible to reduce ripple in the filter characteristics and to increase the value of the fractional band width. The details will be described below. In the following description, "ripple" and "spurious response" will be described as substantially synonymous words.

Figure 3:
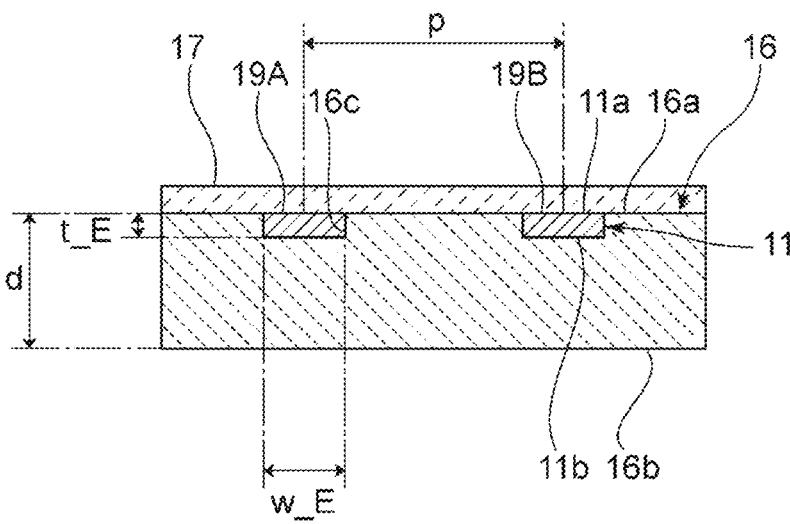
FIG. 3 is a schematic elevational cross-sectional view of an area around a pair of first electrode finger and second electrode finger according to the first preferred embodiment of the present invention.

In the acoustic wave device 10 having the configuration of the first preferred embodiment, in each of the cases where p/d is changed, a resonant frequency and an anti-resonant frequency are measured, and a fractional band width is calculated. A fractional band width is expressed by the mathematical expression (|fa−fr|/fr)×100(%) where the resonant frequency is fr and the anti-resonant frequency is fa. In changing p/d, the thickness d of the piezoelectric layer 16 remains constant, and the electrode finger pitch p is changed. The design parameters of the acoustic wave device 10 are as follows. As schematically shown in FIG. 3, it is assumed that the width of each electrode finger is w_E and the thickness of each electrode finger is t_E. The width of each electrode finger is the dimension of the electrode finger in the electrode finger opposed direction. Incidentally, in FIG. 3, the support substrate 14 and the like are omitted, and an area around a pair of electrode fingers is shown. The same applies to schematic elevational cross-sectional views other than FIG. 3.

The piezoelectric layer 16 is made of Z-cut LiNbO$_3$ with a thickness d of about 0.4 μm, for example.

The interdigital transducer electrode 11 is made of Al and has electrode fingers each having a width w_E of about 1.01 μm and a thickness t_E of about 0.05 μm, for example.

Figure 4:
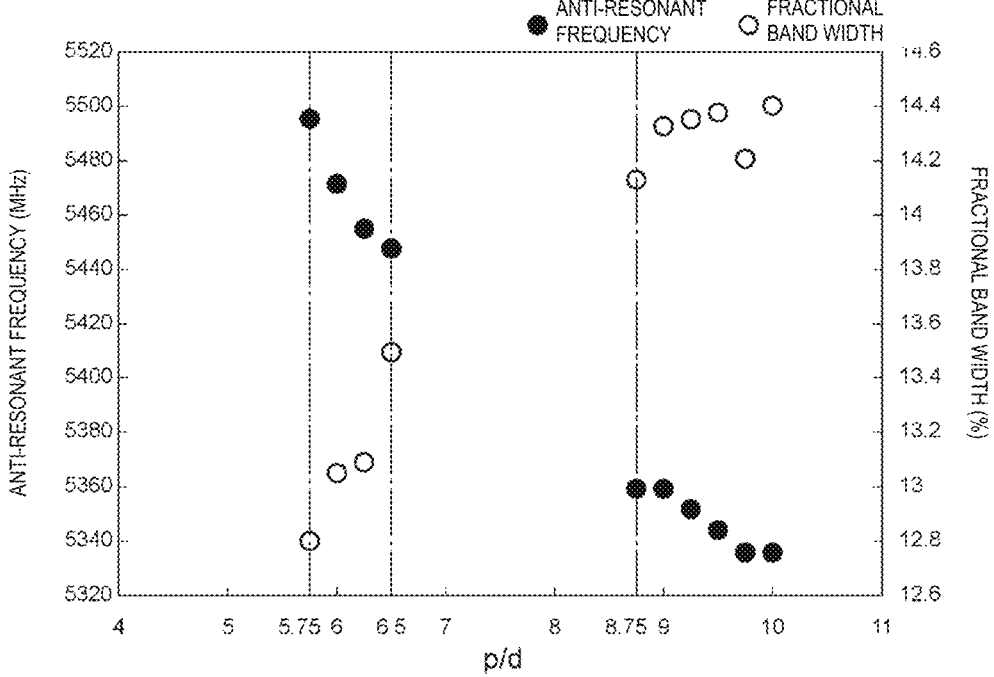
FIG. 4 is a graph that shows the relationship between p/d and anti-resonant frequency and the relationship between p/d and fractional band width according to the first preferred embodiment of the present invention.

FIG. 4 is a graph that shows the relationship between p/d and anti-resonant frequency and the relationship between p/d and fractional band width according to the first preferred embodiment.

As shown in FIG. 4, in the range p/d<about 5.75 and about 6.5<p/d<about 8.75, no plot is provided. This is because, in the above range, a spurious is generated between the resonant frequency and the anti-resonant frequency. In other words, when about 5.75≤p/d≤about 6.5 or p/d≥about 8.75, a spurious response to be generated between the resonant frequency and the anti-resonant frequency is reduced. In addition, as shown in FIG. 4, it was discovered that, when about 5.75≤p/d≤about 6.5 or p/d≥about 8.75, the value of the fractional band width is increased by about 12% or higher. In this case, the acoustic wave device 10 is particularly suitable when used in an N79 filter or the like.

Furthermore, when about 5.75≤p/d≤about 6.5, the electrode finger pitch p is small, so it is possible to effectively facilitate a reduction in the size of the acoustic wave device 10. More specifically, for example, p/d=about 5.75, and p=about 2.3 μm where d=about 0.4. In this case, the electrode finger pitch p is about a half to about two thirds of the electrode finger pitch of an existing one, so it is possible to effectively facilitate a reduction in the size of the acoustic wave device 10.

Here, in each of the cases of different cross sectional areas of each electrode finger, the phases of five spurious responses are measured. In the specification, the cross sectional area of each electrode finger is the area of the cross section of each electrode finger, taken in the electrode finger opposed direction. In changing the cross sectional area of each electrode finger, when the cross sectional area ranges from about 0.02 μm$^2$ to about 0.04 μm$^2$, the thickness t_E of each electrode finger is set to about 0.03 μm, and the width w_E of each electrode finger is changed. When the cross sectional area of each electrode finger ranges from about 0.04 μm$^2$ to about 0.062 μm$^2$, t_E is set to about 0.05 μm, and w_E is changed. When the cross sectional area of each electrode finger ranges from about 0.062 μm$^2$ to about 0.09 μm$^2$, t_E is set to about 0.07 μm, and w_E is changed. The cross sectional area of each electrode finger is the same or substantially the same.

Figure 5:
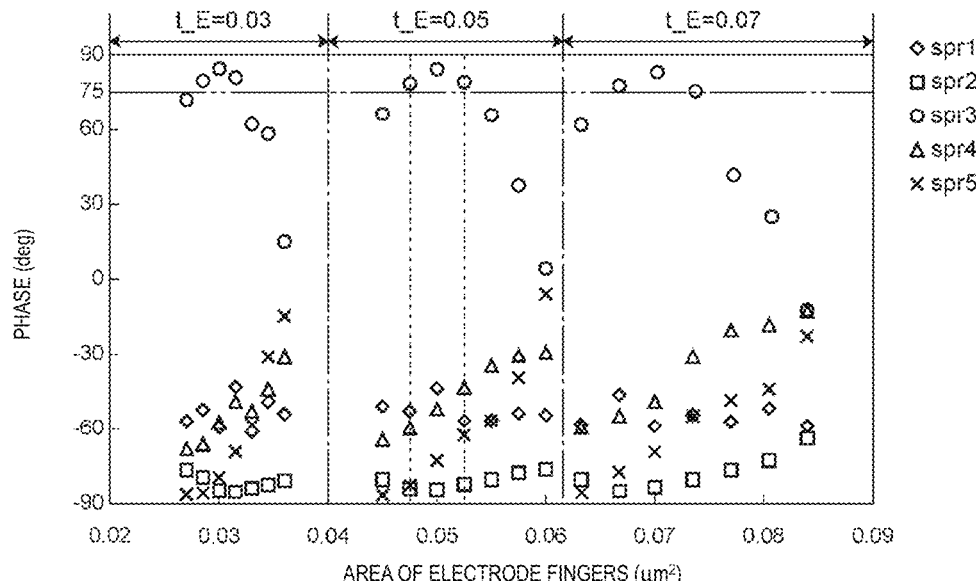
FIG. 5 is a graph that shows the relationship between the cross sectional area of each electrode finger and the phase of each spurious according to the first preferred embodiment of the present invention.

FIG. 5 is a graph that shows the relationship between the cross sectional area of each electrode finger and the phase of each spurious according to the first preferred embodiment. spr1 to spr5 denote five spurious responses. spr1, spr2, spr4, and spr5 are spurious responses that are generated at lower frequencies than the resonant frequency or higher frequencies than the anti-resonant frequency. Thus, as the phases of spr1, spr2, spr4, and spr5 approach −90°, spr1, spr2, spr4, and spr5 are reduced. On the other hand, spr3 is a spurious response that is generated between the resonant frequency and the anti-resonant frequency. Thus, as the phase of spr3 approaches 90°, spr3 is reduced.

As shown in FIG. 5, it was discovered that, in each of the case where the cross sectional area of each electrode finger is set to about 0.03 μm$^2$, the case where the cross sectional area of each electrode finger is set to about 0.05 μm$^2$, and the case where the cross sectional area of each electrode finger is set to about 0.07 μm$^2$, the phase of spr3 takes a local maximum value. In addition, it was discovered that, when the cross sectional area of each electrode finger is around 0.03 μm$^2$ or around 0.05 μm$^2$, that is, in the range of the cross sectional area in which it is possible to effectively reduce spr3, it is also possible to effectively reduce spurious responses other than spr3. Furthermore, as shown in the region surrounded by the dashed line in FIG. 5, it is found that, when the cross sectional area of each electrode finger is around 0.05 μm$^2$, the phase of spr3 is kept higher than or equal to 75 deg in a sufficiently wide range and it is possible to effectively reduce spr3. Specifically, when the cross sectional area of each electrode finger is greater than or equal to about 0.0475 μm$^2$ and less than or equal to about 0.0525 μm$^2$, the phase of spr3 is maintained higher than or equal to about 75 deg.

Figure 6:
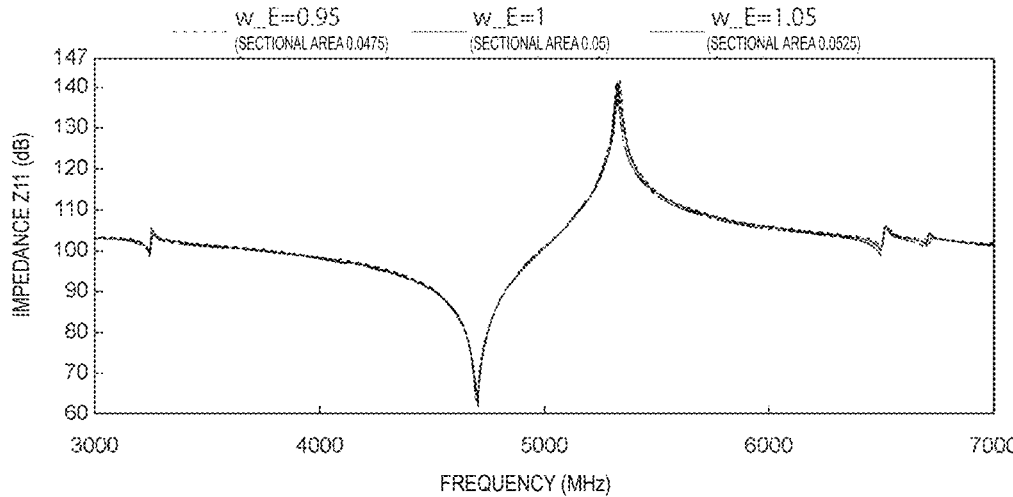
FIG. 6 is a graph that shows impedance frequency characteristics in the case where the cross sectional area of each electrode finger is greater than or equal to about 0.0475 $\mu m^2$ and less than or equal to about 0.0525 $\mu m^2$ according to the first preferred embodiment of the present invention.

FIG. 6 is a graph that shows impedance frequency characteristics in the case where the cross sectional area of each electrode finger is greater than or equal to about 0.0475 μm$^2$ and less than or equal to about 0.0525 μm$^2$ according to the first preferred embodiment.

As shown in FIG. 6, it has been demonstrated that, when the cross sectional area of each electrode finger is greater than or equal to about 0.0475 μm$^2$ and less than or equal to about 0.0525 μm$^2$, spr3 is reduced between the resonant frequency and the anti-resonant frequency even when the width w_E of each electrode finger is different. Thus, in manufacturing the acoustic wave device 10, even when there occurs an error in the width w_E of each electrode finger, it is possible to further reliably and effectively reduce spr3.

Therefore, the cross sectional area of each electrode finger is preferably, for example, greater than or equal to about 0.0475 μm$^2$ and less than or equal to about 0.0525 μm$^2$. At this time, as shown in FIG. 5, it is more preferable that, for example, t_E be 0.05 μm and w_E fall within the range of about 1±0.05 μm. With this configuration, it is possible to effectively reduce spurious responses that are generated at lower frequencies than the resonant frequency and spurious responses that are generated at higher frequencies than the anti-resonant frequency. In addition, it is possible to further reliably and effectively reduce spurious responses that are generated between the resonant frequency and the anti-resonant frequency.

In each of the cases of different cut angles of the piezoelectric layer 16, a resonant frequency and an anti-resonant frequency are measured, and a fractional band width is calculated. In addition, the phase of ripple between the resonant frequency and the anti-resonant frequency is measured. The design parameters of the acoustic wave device 10 are as follows.

For example, the piezoelectric layer 16 is made of LiNbO$_3$ with a thickness d of about 0.4 µm and a cut angle being changed in steps of about 2° in the range of about 110° Y or larger and about 180° Y or smaller.

The interdigital transducer electrode 11 is made of, for example, Al and has electrode fingers each having a width w_E of about 1.01 µm and a thickness t_E of about 0.05 µm and an electrode finger pitch p of about 2.7 µm.

Figure 7:
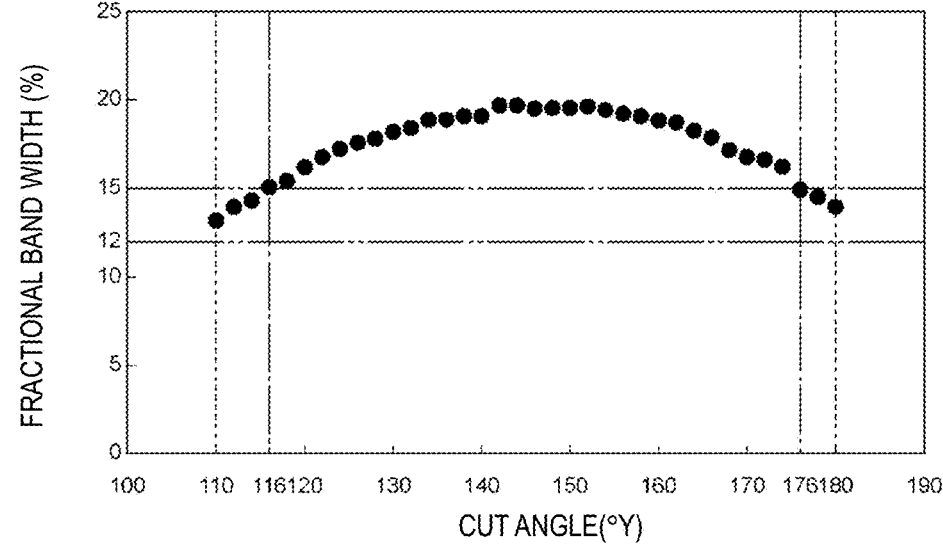
FIG. 7 is a graph that shows the relationship between cut angle and fractional band width according to the first preferred embodiment of the present invention.
Figure 8:
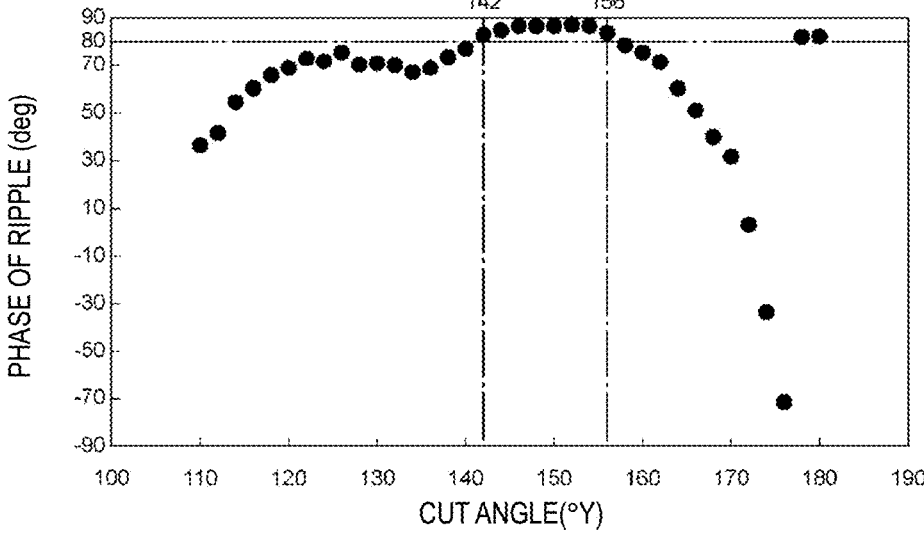
FIG. 8 is a graph that shows the relationship between cut angle and the phase of ripple between a resonant frequency and an anti-resonant frequency according to the first preferred embodiment of the present invention.

FIG. 7 is a graph that shows the relationship between cut angle and fractional band width according to the first preferred embodiment. FIG. 8 is a graph that shows the relationship between cut angle and the phase of ripple between a resonant frequency and an anti-resonant frequency according to the first preferred embodiment.

As shown in FIG. 7, in the range in which the cut angle is larger than or equal to about 110° Y and smaller than or equal to about 180° Y, the value of the fractional band width is kept higher than or equal to about 12%. The cut angle of the lithium niobate layer defining and functioning as the piezoelectric layer 16 is preferably, for example, larger than or equal to about 116° Y and smaller than or equal to about 176° Y. Thus, the value of the fractional band width is maintained higher than or equal to about 15%. In this case, the acoustic wave device 10 is particularly suitable when used in an N77 filter or the like.

As shown in FIG. 8, the phase of a ripple between the resonant frequency and the anti-resonant frequency changes according to a cut angle. For a ripple between the resonant frequency and the anti-resonant frequency, as the phase approaches 90°, the ripple is reduced. The cut angle of the lithium niobate layer defining and functioning as the piezoelectric layer 16 is preferably, for example, larger than or equal to about 142° Y and smaller than or equal to about 156° Y. Thus, the phase of the ripple is confined to larger than or equal to about 80°.

In addition, in each of the cases of different widths w_E of each electrode finger, the relationship between p/d and fractional band width is obtained. In addition, the phase of ripple between the resonant frequency and the anti-resonant frequency is measured. The design parameters of the acoustic wave device 10 are as follows.

The piezoelectric layer 16 is made of LiNbO$_3$ with a thickness d of about 0.4 µm and a cut angle of about 143° Y, for example.

The dielectric film 17 is made of SiO$_2$ with a thickness of about 0.03 µm, for example.

The interdigital transducer electrode 11 is made of Al and has electrode fingers each of which the width w_E is changed in steps of about 0.25 µm in the range of about 0.25 µm or greater and about 1 µm or less, for example.

Figure 9:
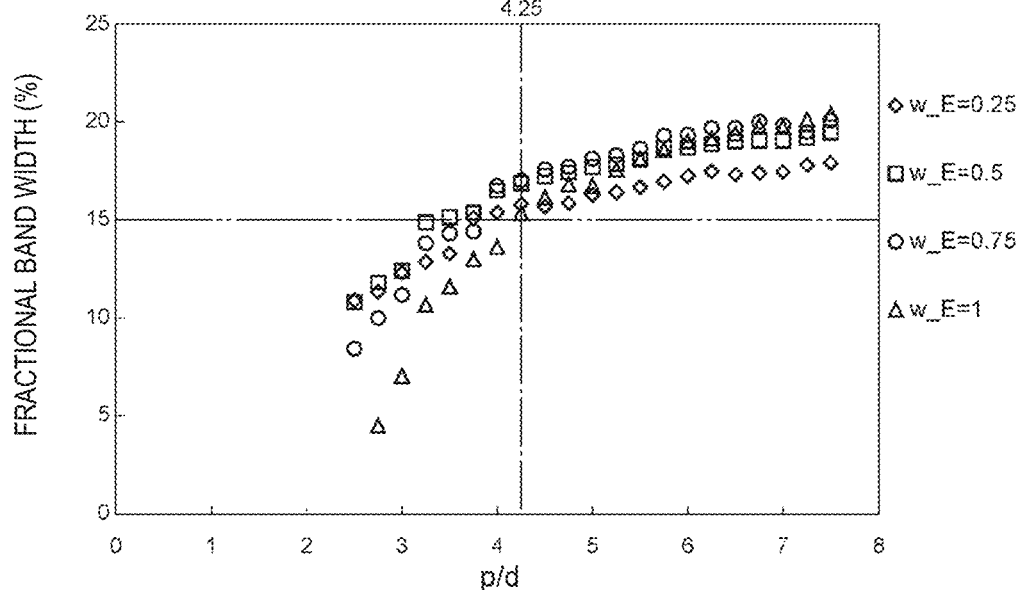
FIG. 9 is a graph that shows the relationship between p/d and fractional band width for the width w of each electrode finger according to the first preferred embodiment of the present invention.

FIG. 9 is a graph that shows the relationship between p/d and the width w_E of each electrode finger and the relationship between p/d and fractional band width according to the first preferred embodiment.

As shown in FIG. 9, even in the case of any width w_E of each electrode finger, as p/d increases, the value of the fractional band width increases. It is preferable that, for example, p/d≥about 4.25. Thus, in the range of about 0.25 µm≤w_E≤about 1 µm, the fractional band width is maintained higher than or equal to about 15%.

Table 1 and Table 2 show the relationship among the width w_E of each electrode finger, p/d, and the phase of ripple between the resonant frequency and the anti-resonant frequency. Table 2 shows in detail the relationship in the range in which the value of the phase of ripple is particularly large.

TABLE 1

|  | 0.25 | 0.5 | 0.75 | 1 |
|---|---|---|---|---|
| Phase of Ripple (p = 1.7 µm, p/d = 4.25) | 7.6 | 45.1 | 56.1 | −9.7 |
| Phase of Ripple (p = 1.8 µm, p/d = 4.5) | 39.5 | 66.4 | 60.9 | 11.0 |
| Phase of Ripple (p = 1.9 µm, p/d = 4.75) | 39.4 | 59.1 | 69.6 | −2.0 |
| Phase of Ripple (p = 2 µm, p/d = 5) | 66.1 | 72.7 | 70.2 | 74.6 |
| Phase of Ripple (p = 2.1 µm, p/d = 5.25) | 62.3 | 72.5 | 75.5 | 73.6 |
| Phase of Ripple (p = 2.2 µm, p/d = 5.5) | 65.7 | 75.0 | 74.8 | 76.6 |
| Phase of Ripple (p = 2.3 µm, p/d = 5.75) | 66.4 | 74.5 | 45.0 | 79.0 |
| Phase of Ripple (p = 2.4 µm, p/d = 6) | 69.4 | 76.7 | 80.0 | 79.8 |
| Phase of Ripple (p = 2.5 µm, p/d = 6.25) | 37.3 | 80.1 | 79.6 | 82.5 |
| Phase of Ripple (p = 2.6 µm, p/d = 6.5) | 77.2 | 70.7 | 80.7 | 82.1 |
| Phase of Ripple (p = 2.7 µm, p/d = 6.75) | 77.8 | 80.8 | 81.9 | 82.9 |
| Phase of Ripple (p = 2.8 µm, p/d = 7) | 79.5 | 84.9 | 84.1 | 86.1 |
| Phase of Ripple (p = 2.9 µm, p/d = 7.25) | 79.6 | 82.7 | 76.9 | 59.1 |
| Phase of Ripple (p = 3 µm, p/d = 7.5) | 81.7 | 82.1 | 59.1 | 74.0 |

TABLE 2

|  | 0.7 | 0.75 | 0.8 | 0.85 | 0.9 | 0.95 | 1 | 1.05 | 1.1 | 1.15 | 1.2 | 1.25 | 1.3 |
|---|---|---|---|---|---|---|---|---|---|---|---|---|---|
| Phase of Ripple (p = 2.5 µm, p/d = 6.25) | 79.8 | 79.6 | 81.5 | 80.2 | 82.0 | 80.5 | 82.5 | 80.9 | 81.4 | 79.6 | 73.7 | 68.4 | 67.6 |
| Phase of Ripple (p = 2.55 µm, p/d = 6.375) | 80.5 | 81.4 | 82.0 | 81.4 | 81.8 | 82.2 | 81.3 | 82.3 | 82.8 | 81.9 | 82.0 | 82.8 | 82.5 |
| Phase of Ripple (p = 2.6 µm, p/d = 6.5) | 80.7 | 80.7 | 81.1 | 81.3 | 83.3 | 82.5 | 82.1 | 82.1 | 83.3 | 82.2 | 83.5 | 82.8 | 82.3 |
| Phase of Ripple (p = 2.65 µm, p/d = 6.625) | 81.5 | 81.4 | 81.9 | 82.5 | 81.9 | 82.1 | 82.4 | 82.7 | 84.1 | 83.3 | 82.9 | 83.6 | 82.8 |
| Phase of Ripple (p = 2.7 µm, p/d = 6.75) | 81.4 | 81.9 | 82.6 | 83.5 | 83.4 | 82.7 | 82.9 | 83.6 | 83.2 | 84.1 | 83.5 | 84.4 | 83.2 |
| Phase of Ripple (p = 2.75 µm, p/d = 6.875) | 81.9 | 82.1 | 83.2 | 82.9 | 83.2 | 83.5 | 83.7 | 83.8 | 84.4 | 84.7 | 85.2 | 85.9 | 85.4 |
| Phase of Ripple (p = 2.8 µm, p/d = 7) | 85.6 | 84.1 | 82.8 | 85.4 | 86.2 | 85.5 | 86.1 | 85.3 | 85.8 | 85.1 | 84.4 | 84.2 | 84.5 |

As shown in Table 1, it was discovered that, in the range of about $6.25 \leq p/d \leq$ about 7, the value of the phase of the ripple is large in the range in which the width w_E of each electrode finger is wide. As shown in Table 2, it was discovered that the value of the phase of ripple is particularly large in the range of about $0.7 \ \mu m \leq w\_E \leq$ about $1.15 \ \mu m$. Thus, it is preferable, for example, that about $6.25 \leq p/d \leq$ about 7 and about $0.7 \ \mu m \leq w\_E \leq$ about $1.15 \ \mu m$. In this case, it is possible to effectively reduce the ripple between the resonant frequency and the anti-resonant frequency.

Figure 10:
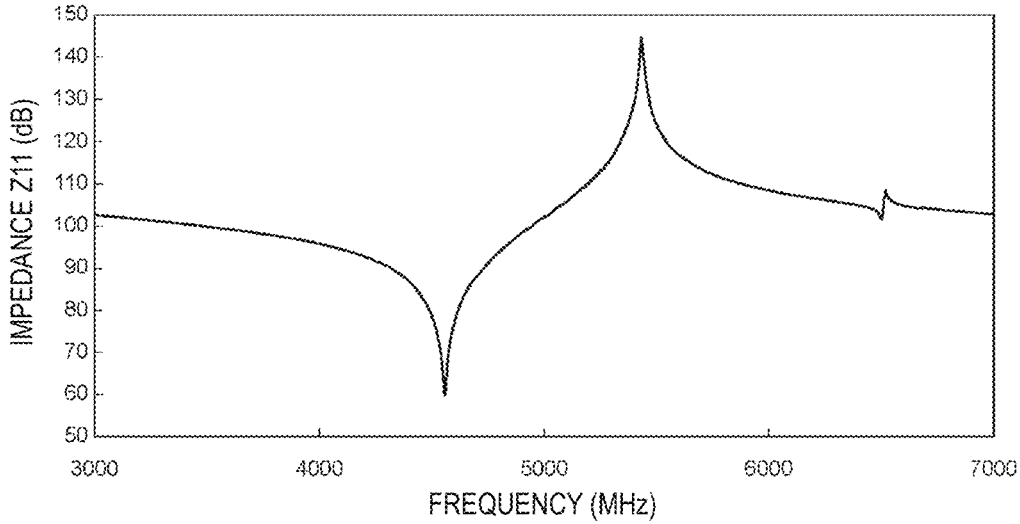
FIG. 10 is a graph that shows the impedance frequency characteristics in the case where w_E=about 1 μm and p/d=about 6.25 according to the first preferred embodiment of the present invention.

When, for example, $w\_E=1 \ \mu m$ and $p/d=$about 6.25, the value of the fractional band width is increased to about 19.3%. In addition, when $w\_E=$about $1 \ \mu m$ and $p/d=$about 6.25, it is possible to reduce the ripple as in the case of the impedance frequency characteristics shown in FIG. 10. More specifically, the design parameters of the acoustic wave device 10 are as follows.

The piezoelectric layer 16 is made of $LiNbO_3$ with a thickness d of about $0.4 \ \mu m$ and a cut angle of about 150° Y.

The dielectric film 17 is made of $SiO_2$ with a thickness of about $0.03 \ \mu m$.

The interdigital transducer electrode 11 is made of Al and has electrode fingers each having a width w_E of about $1 \ \mu m$ and an electrode finger pitch p of about $2.5 \ \mu m$.

In the following description, a first modification and a second modification of the first preferred embodiment will be described with reference to the schematic elevational cross-sectional views. With the first modification and the second modification as well, as in the case of the first preferred embodiment, it is possible to increase the capacitance and facilitate a reduction in the size of the acoustic wave device.

Figure 11:
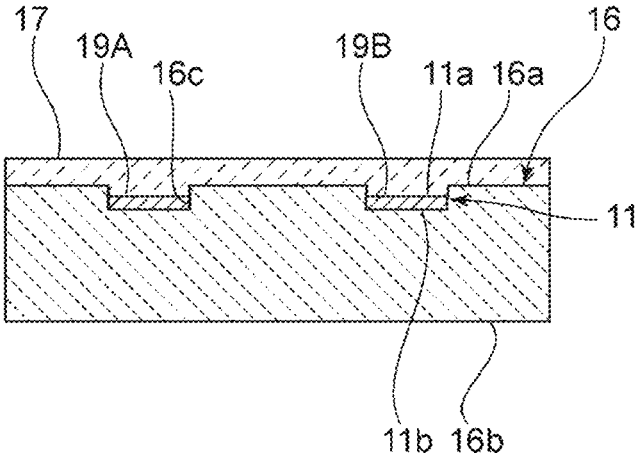
FIG. 11 is a schematic elevational cross-sectional view of an area around a pair of first electrode finger and second electrode finger according to a first modification of the first preferred embodiment of the present invention.

In the first modification shown in FIG. 11, the first surface 11a of the interdigital transducer electrode 11 is located closer to the second principal surface 16b than a portion of the first principal surface 16a of the piezoelectric layer 16 where the recessed portion 16c is not provided. The dielectric film 17 reaches the inside of the recessed portion 16c.

Figure 12:
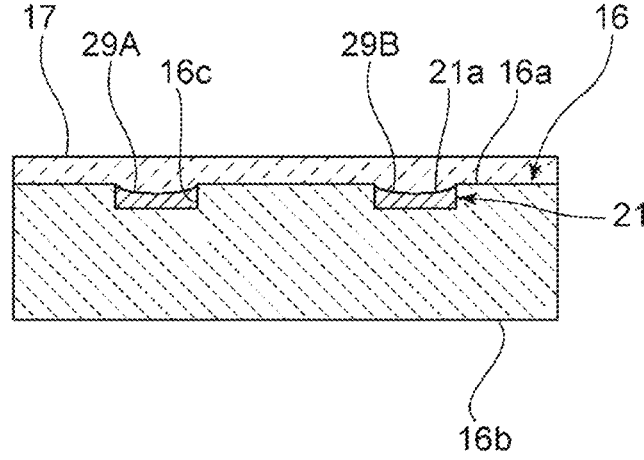
FIG. 12 is a schematic elevational cross-sectional view of an area around a pair of first electrode finger and second electrode finger according to a second modification of the first preferred embodiment of the present invention.

In the second modification shown in FIG. 12, a first surface 21a of an interdigital transducer electrode 21 has a recessed shape at a portion corresponding to a first electrode finger 29A and a portion corresponding to a second electrode finger 29B. More specifically, in the present modification, the thickness of a central portion, in the electrode finger opposed direction, of the first electrode finger 29A is less than the thickness of each end edge portion in the direction. The same applies to the second electrode finger 29B. The dielectric film 17 extends to a recessed portion of the first surface 21a.

Figure 13:
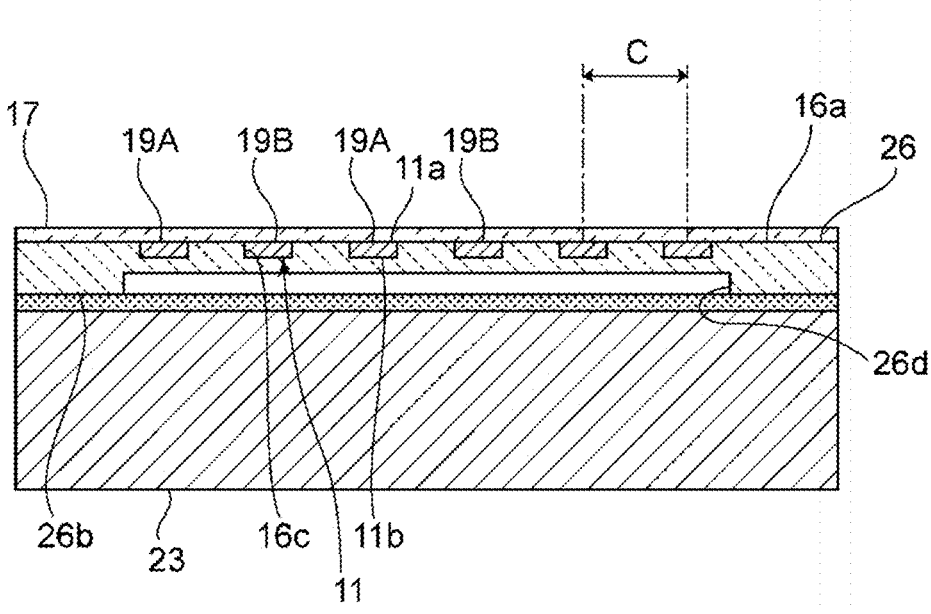
FIG. 13 is an elevational cross-sectional view of an acoustic wave device according to a third modification of the first preferred embodiment of the present invention.

As described above, a cavity may be provided in the piezoelectric layer 26. In a third modification of the first preferred embodiment shown in FIG. 13, a recessed portion 26d is provided on a second principal surface 26b of a piezoelectric layer 26. The recessed portion 26d is a cavity provided in the piezoelectric layer 26. On the other hand, no cavity is provided in the support 23. An open portion in the recessed portion 26d of the piezoelectric layer 26 is closed by the support 23.

The acoustic wave device according to preferred embodiments of the present invention can be used in, for example, a ladder filter. This example will be described below.

Figure 14:
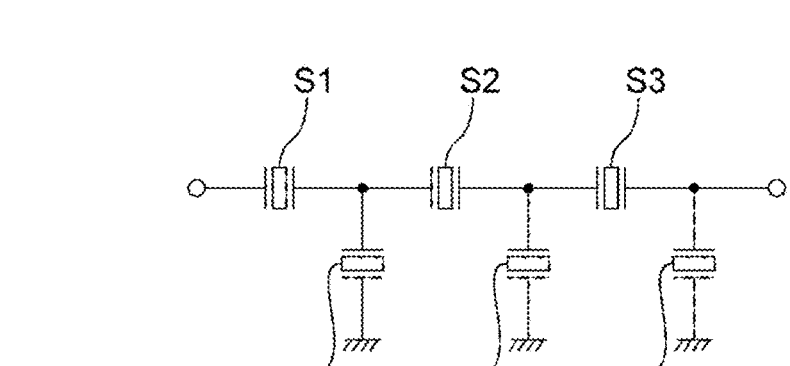
FIG. 14 is a circuit diagram of a ladder filter according to a second preferred embodiment of the present invention.

FIG. 14 is a circuit diagram of a ladder filter according to a second preferred embodiment of the present invention.

A ladder filter 30 includes a plurality of series arm resonators and a plurality of parallel arm resonators. The plurality of series arm resonators include a series arm resonator S1, a series arm resonator S2, and a series arm resonator S3. The plurality of parallel arm resonators include a parallel arm resonator P1, a parallel arm resonator P2, and a parallel arm resonator P3.

In the ladder filter 30, the series arm resonator S1, the series arm resonator S2, and the series arm resonator S3 are connected in series with each other. The parallel arm resonator P1 is connected between a ground potential and a junction point between the series arm resonator S1 and the series arm resonator S2. The parallel arm resonator P2 is connected between the ground potential and a junction point between the series arm resonator S2 and the series arm resonator S3. The parallel arm resonator P3 is connected between the ground potential and a junction point between the series arm resonator S3 and a signal end. The circuit configuration of the ladder filter 30 is not limited thereto. The ladder filter 30 only needs to include at least one series arm resonator and at least one parallel arm resonator.

In the present preferred embodiment, the series arm resonators and the parallel arm resonators each have the same or similar configuration to that of the first preferred embodiment. Of the plurality of series arm resonators and the plurality of parallel arm resonators, at least one resonator only needs to be an acoustic wave device according to a preferred embodiment of the present invention. Since each of the resonators of the ladder filter 30 has the same or similar configuration to that of the first preferred embodiment, it is possible to reduce the capacitance. Thus, it is possible to facilitate a reduction in the size of the ladder filter 30.

At least one parallel arm resonator is preferably an acoustic wave device according to a preferred embodiment of the present invention. The resonant frequency of a parallel arm resonator generally needs to be lower than the resonant frequency of a series arm resonator. Therefore, generally, the electrode finger pitch of an interdigital transducer electrode in a parallel arm resonator is increased. This case leads to an increase in the size of a ladder filter. In contrast, when the parallel arm resonator is, for example, the acoustic wave device 10 according to the first preferred embodiment, it is possible to decrease the frequency by adjusting the thickness of the dielectric film 17 without increasing the electrode finger pitch. Therefore, it is possible to further reliably facilitate a reduction in the size of the ladder filter 30.

Figure 15:
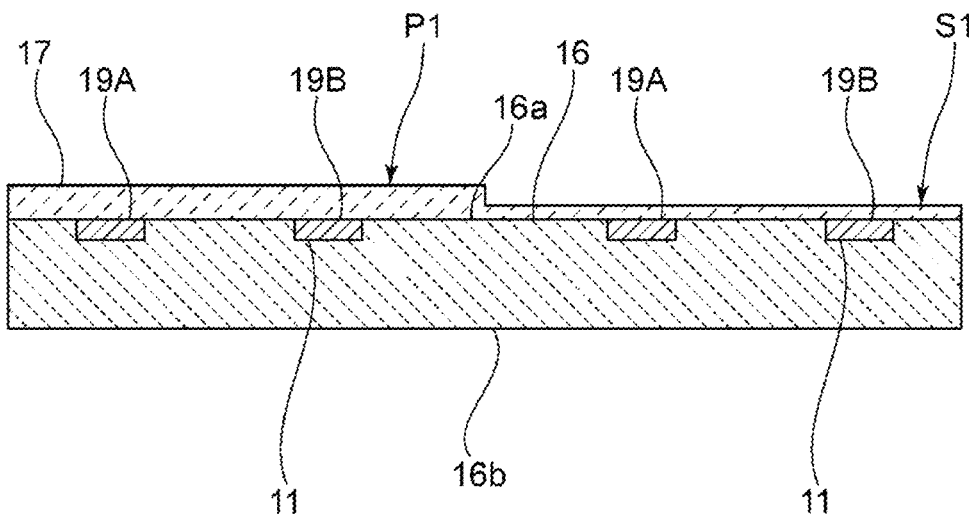
FIG. 15 is a schematic elevational cross-sectional view that shows a portion of the ladder filter according to the second preferred embodiment of the present invention.
Figure 16:
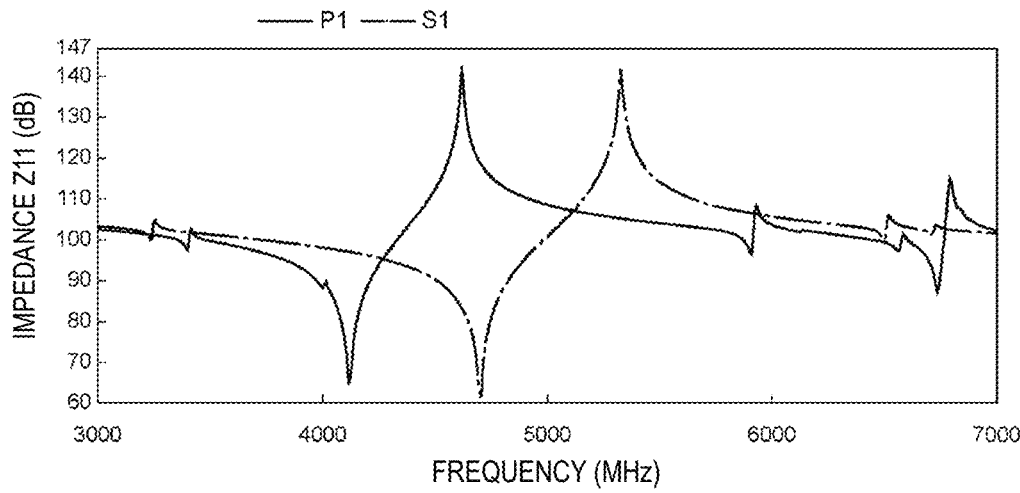
FIG. 16 is a graph that shows the impedance frequency characteristics of a series arm resonator and the impedance frequency characteristics of a parallel arm resonator according to the second preferred embodiment of the present invention.

FIG. 15 is a schematic elevational cross-sectional view that shows a portion of the ladder filter according to the second preferred embodiment. FIG. 16 is a graph that shows the impedance frequency characteristics of a series arm resonator and the impedance frequency characteristics of a parallel arm resonator according to the second preferred embodiment. FIG. 15 schematically shows an area around a pair of electrode fingers of each resonator, as in the case of FIG. 3 and the like.

As shown in FIG. 15, in the present preferred embodiment, the series arm resonator S1 and the parallel arm resonator P1 each have the same or similar configuration to that of the first preferred embodiment. The series arm resonator S1 and the parallel arm resonator P1 share the piezoelectric layer 16. The dielectric film 17 in the series arm resonator S1 and the dielectric film 17 in the parallel arm resonator P1 are integrated.

The thickness of the dielectric film 17 in the series arm resonator S1 is different from the thickness of the dielectric film 17 in the parallel arm resonator P1. Thus, the resonant frequency of the series arm resonator S1 is different from the resonant frequency of the parallel arm resonator P1. More specifically, the thickness of the dielectric film 17 in the parallel arm resonator P1 is greater than the thickness of the dielectric film 17 in the series arm resonator S1. Thus, as shown in FIG. 16, the resonant frequency of the parallel arm resonator P1 is lower than the resonant frequency of the series arm resonator S1.

In the ladder filter 30, each of the series arm resonator S1 and the parallel arm resonator P1 is an acoustic wave device according to a preferred embodiment of the present invention. In this case, the electrode finger pitch of the interdigital transducer electrode 11 in the series arm resonator S1 may be the same or substantially the same as the electrode finger pitch of the interdigital transducer electrode 11 in the parallel arm resonator P1. In this case as well, as described above, the frequency of each resonator is easily adjusted. In addition, manufacturing the ladder filter 30 is easy, so it is possible to increase productivity.

In the following description, the thickness-shear mode will be described in detail. Here, the support in the following example corresponds to the support substrate according to a preferred embodiment of the present invention.

Figures 17A, 17B:
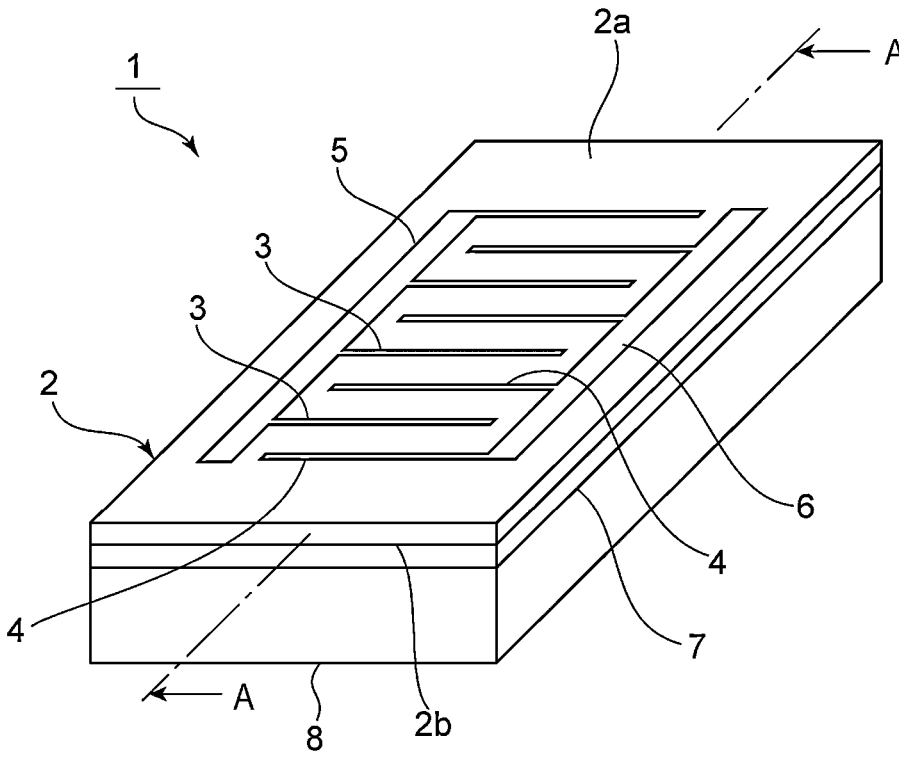
FIG. 17A is a schematic perspective view that shows the external appearance of an acoustic wave device that uses bulk waves in a thickness-shear mode.
FIG. 17B is a plan view that shows an electrode structure on a piezoelectric layer.
Figure 18:
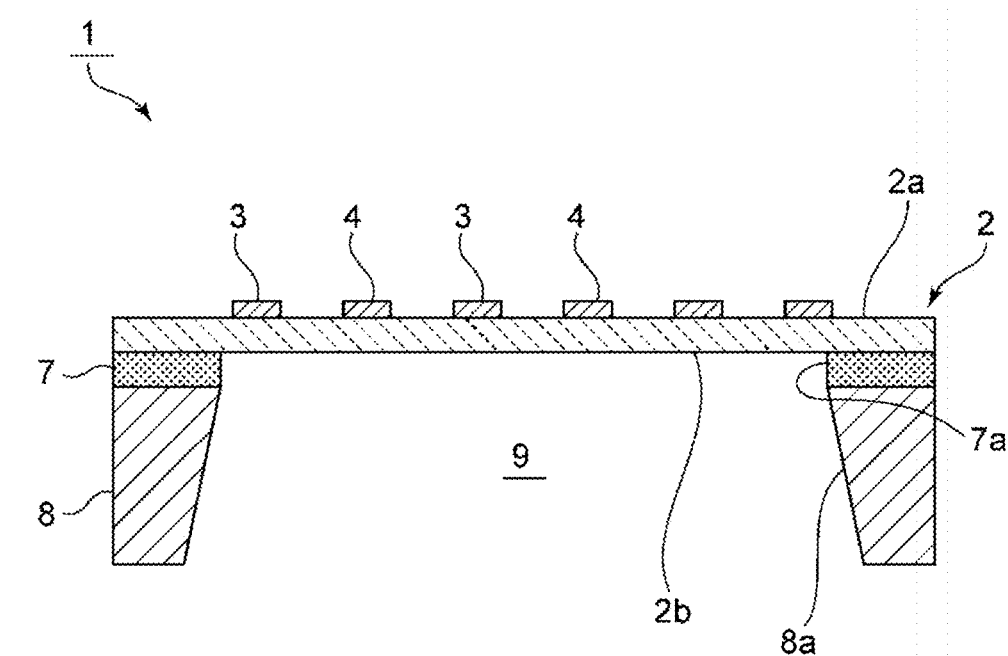
FIG. 18 is a cross-sectional view taken along the line A-A in FIG. 17A.

FIG. 17A is a schematic perspective view that shows the external appearance of an acoustic wave device that uses bulk waves in a thickness-shear mode. FIG. 17B is a plan view that shows an electrode structure on a piezoelectric layer. FIG. 18 is a cross-sectional view taken along the line A-A in FIG. 17A.

An acoustic wave device 1 includes a piezoelectric layer 2 made of, for example, $LiNbO_3$. The piezoelectric layer 2 may be made of, for example, $LiTaO_3$. The cut angle of $LiNbO_3$ or $LiTaO_3$ is Z-cut in the present preferred embodiment and may be rotated Y-cut or X-cut. The thickness of the piezoelectric layer 2 is not limited and is preferably, for example, greater than or equal to about 40 nm and less than or equal to about 1000 nm and more preferably greater than or equal to about 50 nm and less than or equal to about 600 nm to effectively excite a thickness-shear mode. The piezoelectric layer 2 includes opposed first and second principal surfaces 2a, 2b. Electrodes 3 and electrodes 4 are provided on the first principal surface 2a. Here, the electrodes 3 are examples of the "first electrode", and the electrodes 4 are examples of the "second electrode". In FIGS. 17A and 17B, the plurality of electrodes 3 are connected to a first busbar 5. The plurality of electrodes 4 are connected to a second busbar 6. The plurality of electrodes 3 and the plurality of electrodes 4 are interdigitated with each other. The electrodes 3 and the electrodes 4 each have a rectangular or substantially rectangular shape and have a length direction. In a direction orthogonal or substantially orthogonal to the length direction, each of the electrodes 3 and an adjacent one of the electrodes 4 are opposed to each other. The length direction of the electrodes 3, 4 and the direction orthogonal or substantially orthogonal to the length direction of the electrodes 3, 4 both are directions that intersect with a thickness direction of the piezoelectric layer 2. For this reason, each of the electrodes 3 and an adjacent one of the electrodes 4 may be regarded as being opposed to each other in the direction that intersects with the thickness direction of the piezoelectric layer 2. Alternatively, the length direction of the electrodes 3, 4 may be interchanged with the direction orthogonal or substantially orthogonal to the length direction of the electrodes 3, 4, shown in FIGS. 17A and 17B. In other words, in FIGS. 17A and 17B, the electrodes 3, 4 may be extended in a direction in which the first busbar 5 and the second busbar 6 extend. In this case, the first busbar 5 and the second busbar 6 extend in the direction in which the electrodes 3, 4 extend in FIGS. 17A and 17B. A plurality of pairs of adjacent electrodes 3, 4 respectively connected to one potential and the other potential is provided in the direction orthogonal or substantially orthogonal to the length direction of the electrodes 3, 4. Here, a state where the electrode 3 and the electrode 4 are adjacent to each other does not mean a case where the electrode 3 and the electrode 4 are disposed so as to be in direct contact with each other and means a case where the electrode 3 and the electrode 4 are disposed with a gap therebetween. When the electrode 3 and the electrode 4 are adjacent to each other, no electrode connected to a hot electrode or a ground electrode, including the other electrodes 3, 4, is disposed between the electrode 3 and the electrode 4. The number of the pairs is not necessarily an integer number of pairs and may be, for example, 1.5 pairs, 2.5 pairs, or the like. A distance between the centers of the electrodes 3, 4, that is, pitch, preferably falls within the range of greater than or equal to about 1 μm and less than or equal to about 10 μm, for example. A distance between the centers of the electrodes 3, 4 is a distance between the center of the width dimension of the electrode 3 in the direction orthogonal or substantially orthogonal to the length direction of the electrode 3 and the center of the width dimension of the electrode 4 in the direction orthogonal or substantially orthogonal to the length direction of the electrode 4. The width of each of the electrodes 3, 4, that is, the dimension of each of the electrodes 3, 4 in the opposed direction, preferably falls within the range of greater than or equal to about 50 nm and less than or equal to about 1000 nm and more preferably falls within the range of greater than or equal to about 150 nm and less than or equal to about 1000 nm, for example. The distance between the centers of the electrodes 3, 4 is the distance between the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the present preferred embodiment, since the Z-cut piezoelectric layer is used, the direction orthogonal or substantially orthogonal to the length direction of the electrodes 3, 4 is a direction orthogonal or substantially orthogonal to a polarization direction of the piezoelectric layer 2. When a piezoelectric body with another cut angle is used as the piezoelectric layer 2, this does not apply. Here, the term "orthogonal" is not limited only to a strictly orthogonal case and may be substantially orthogonal (an angle formed between the direction orthogonal to the length direction of the electrodes 3, 4 and the polarization direction is, for example, within the range of about 90°±10°).

A support 8 is laminated via an electrically insulating layer 7 to the second principal surface 2b of the piezoelectric layer 2. As shown in FIG. 18, the electrically insulating layer 7 has a frame shape and includes a through-hole (cavity) 7a, and the support 8 has a frame shape and includes a through-hole (cavity) 8a. With this configuration, a cavity 9 is defined. The cavity 9 is provided so as not to impede vibrations of excitation regions of the piezoelectric layer 2. Therefore, the support 8 is laminated to the second principal surface 2b via the electrically insulating layer 7 at a location that does not overlap a portion where the at least one pair of electrodes 3, 4 is provided. The electrically insulating layer 7 does not need to be provided. Therefore, the support 8 can be laminated directly or indirectly on the second principal surface 2b of the piezoelectric layer 2.

The electrically insulating layer 7 is made of, for example, silicon oxide. Other than silicon oxide, for example, an appropriate electrically insulating material, such as silicon oxynitride and alumina, may be used. The support 8 is made of, for example, Si. The plane direction of a piezoelectric layer 2-side surface of Si may be (100) or may be (110) or (111). For example, Si that is a component of the support 8 preferably has a high resistance with a resistivity of higher than or equal to about 2 kΩ and more preferably has a high resistance with a resistivity of higher than or equal to about 4 kΩ. The support 8 may also be made of, for example, an appropriate electrically insulating material or an appropriate semiconductor material.

The plurality of electrodes 3, 4 and the first and second busbars 5, 6 are made of an appropriate metal or alloy, such as, for example, Al and AlCu alloy. In the present preferred embodiment, the electrodes 3, 4 and the first and second busbars 5, 6 have, for example, a structure in which an Al film is laminated on a Ti film. An adhesion layer other than a Ti film may be used.

At the time of driving, an alternating-current voltage is applied between the plurality of electrodes 3 and the plurality of electrodes 4. More specifically, an alternating-current voltage is applied between the first busbar 5 and the second busbar 6. With this configuration, resonant characteristics that use bulk waves in the thickness-shear mode, which are excited in the piezoelectric layer 2, can be obtained. In the acoustic wave device 1, when the thickness of the piezoelectric layer 2 is d and the distance between the centers of any adjacent electrodes 3, 4 of the plurality of pairs of electrodes 3, 4 is p, d/p is less than or equal to about 0.5, for example. For this reason, bulk waves in the thickness-shear mode are effectively excited, so good resonant characteristics are obtained. More preferably, for example, d/p is less than or equal to about 0.24, and, in this case, further good resonant characteristics are obtained.

Since the acoustic wave device 1 has the above-described configuration, the quality factor is unlikely to decrease even when the number of pairs of the electrodes 3, 4 is reduced for the purpose of reducing the size. This is because a propagation loss is small even when the number of electrode fingers in a reflector at each side is reduced. The reason why the number of the electrode fingers can be reduced is because bulk waves in the thickness-shear mode are used. The difference between Lamb waves used in the acoustic wave device and bulk waves in the thickness-shear mode will be described with reference to FIGS. 19A and 19B.

Figure 19A:
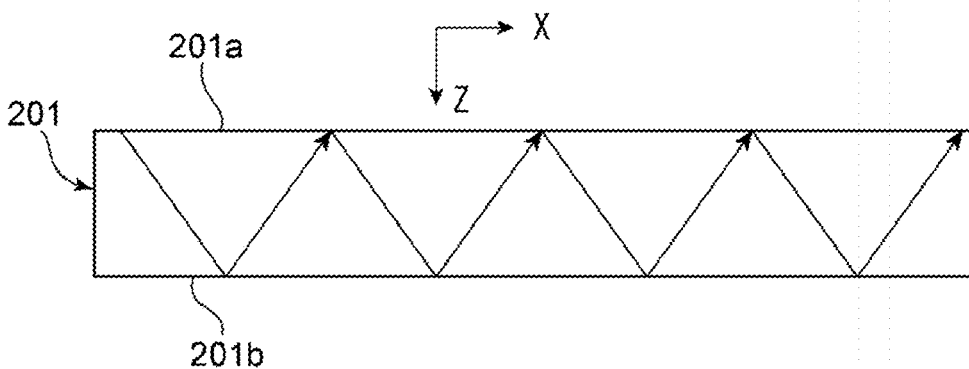
FIG. 19A is a schematic elevational cross-sectional view for illustrating Lamb waves that propagate in a piezoelectric film of the acoustic wave device.

FIG. 19A is a schematic elevational cross-sectional view for illustrating Lamb waves that propagate in a piezoelectric film of an acoustic wave device as described in U.S. Pat. No. 10,491,192. Here, the waves propagate in a piezoelectric film 201 as indicated by the arrows. Here, in the piezoelectric film 201, a first principal surface 201*a* and a second principal surface 201*b* are opposed to each other, and a thickness direction connecting the first principal surface 201*a* and the second principal surface 201*b* is a Z direction. An X direction is a direction in which electrode fingers of an interdigital transducer electrode are arranged. As shown in FIG. 19A, for Lamb waves, the waves propagate in the X direction as shown in the drawing. The waves are plate waves, so the piezoelectric film 201 vibrates as a whole. However, the waves propagate in the X direction. Therefore, resonant characteristics are obtained by arranging a reflector on each side. For this reason, a wave propagation loss occurs, and the quality factor decreases when the size is reduced, that is, when the number of pairs of electrode fingers is reduced.

Figure 19B:
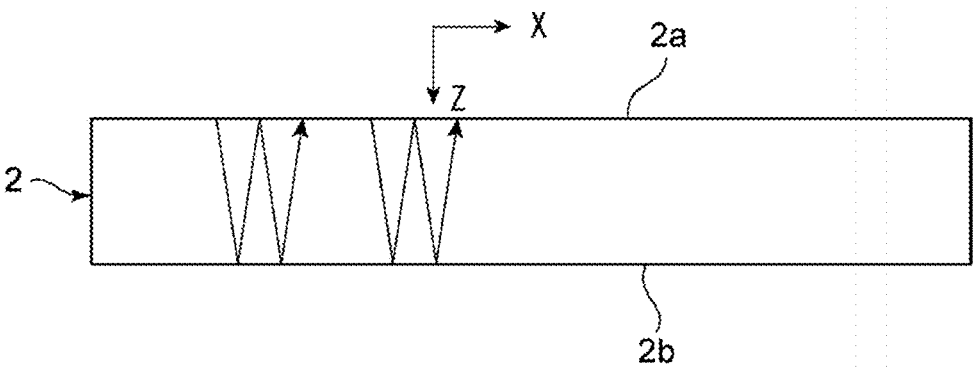
FIG. 19B is a schematic elevational cross-sectional view for illustrating bulk waves in the thickness-shear mode, which propagate through the piezoelectric film in the acoustic wave device.

In contrast, as shown in FIG. 19B, in the acoustic wave device 1, a vibration displacement is caused in the thickness-shear direction, so the waves propagate in or substantially in the direction connecting the first principal surface 2*a* and the second principal surface 2*b* of the piezoelectric layer 2, that is, the Z direction, and resonate. In other words, the X-direction components of the waves are significantly smaller than the Z-direction components. Since the resonant characteristics are obtained from the propagation of the waves in the Z direction, a propagation loss is difficult to occur even when the number of electrode fingers of the reflectors is reduced. In addition, even when the number of pairs of electrodes including the electrodes 3, 4 is reduced to reduce the size, the quality factor is unlikely to decrease.

Figure 20:
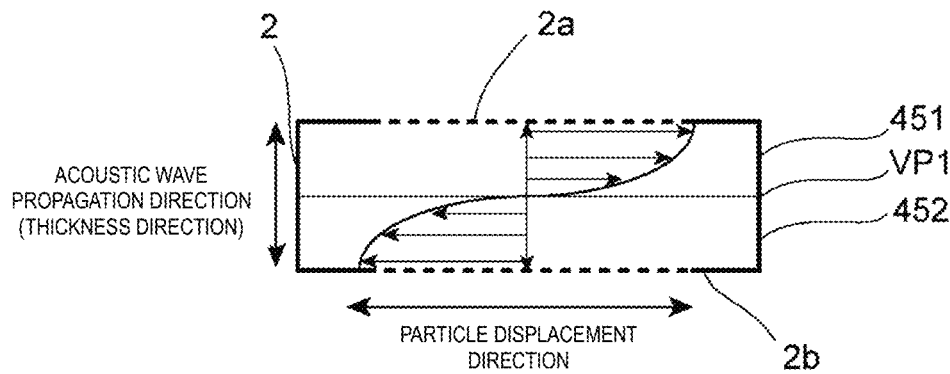
FIG. 20 is a view that shows an amplitude direction of bulk waves in the thickness-shear mode.

As shown in FIG. 20, the amplitude direction of the bulk waves in the thickness-shear mode is opposite between a first region 451 included in the excitation region of the piezoelectric layer 2 and a second region 452 included in the excitation region. FIG. 20 schematically shows bulk waves when a voltage with which the electrodes 4 are higher in potential than the electrodes 3 is applied between the electrodes 3 and the electrodes 4. The first region 451 is a region in the excitation region between the first principal surface 2*a* and a virtual plane VP1 that is orthogonal to the thickness direction of the piezoelectric layer 2 and that divides the piezoelectric layer 2 into two. The second region 452 is a region in the excitation region between the virtual plane VP1 and the second principal surface 2*b*.

As described above, in the acoustic wave device 1, at least one pair of electrodes including the electrode 3 and the electrode 4 is provided. However, the waves are not caused to propagate in the X direction, so the number of pairs of electrodes of the electrodes 3, 4 does not need to be multiple. In other words, at least one pair of electrodes only needs to be provided.

For example, the electrode 3 is an electrode connected to a hot potential, and the electrode 4 is an electrode connected to a ground potential. The electrode 3 may be connected to a ground potential, and the electrode 4 may be connected to a hot potential. In the present preferred embodiment, each of the at least one pair of electrodes is an electrode connected to a hot potential or an electrode connected to a ground potential as described above, and no floating electrode is provided.

Figure 21:
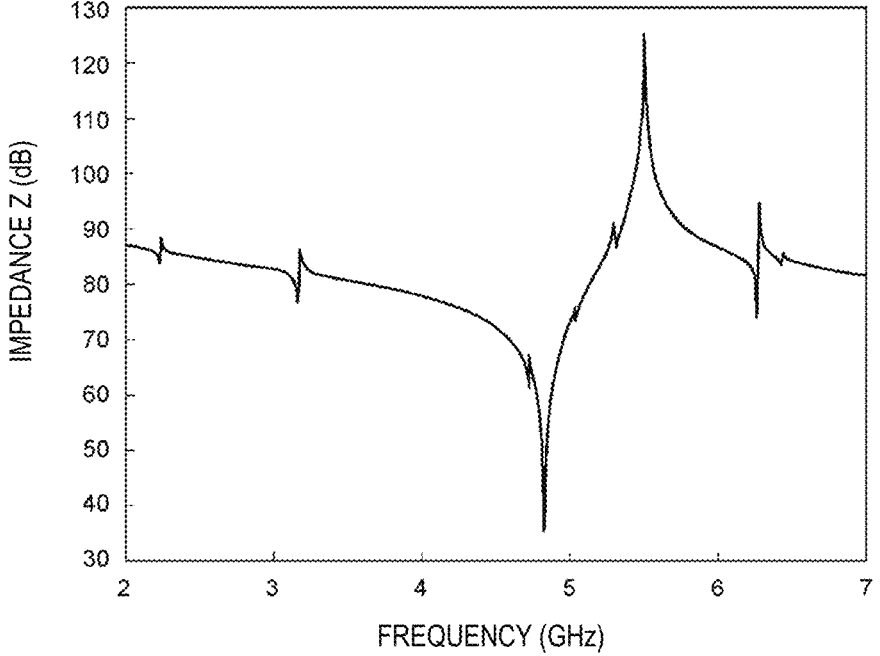
FIG. 21 is the resonant characteristics of an acoustic wave device that uses bulk waves in the thickness-shear mode.

FIG. 21 is a graph that shows the resonant characteristics of the acoustic wave device shown in FIG. 18. The design parameters of the acoustic wave device 1 having the resonant characteristics are as follows.

The piezoelectric layer 2 is made of LiNbO₃ with Euler angles of (0°, 0°, 90°) and has a thickness of about 400 nm.

When viewed in a direction orthogonal or substantially orthogonal to the length direction of the electrodes 3 and the electrodes 4, the length of a region in which the electrodes 3 and the electrodes 4 overlap, that is, the excitation region C, is about 40 μm, the number of pairs of electrodes including the electrodes 3, 4 is 21, the distance between the centers of the electrodes is about 3 μm, the width of each of the electrodes 3, 4 is about 500 nm, and d/p is about 0.133.

The electrically insulating layer 7 is made of, for example, a silicon oxide film having a thickness of about 1 μm.

The support 8 is made of, for example, Si.

The length of the excitation region C is the dimension of the excitation region C along the length direction of the electrodes 3, 4.

In the acoustic wave device 1, the distance between any adjacent electrodes of the pairs of electrodes including the electrodes 3, 4 is equal or substantially equal among all of the plurality of pairs. In other words, the electrodes 3 and the electrodes 4 are disposed at a constant or substantially constant pitch.

As is apparent from FIG. 21, although no reflectors are provided, good resonant characteristics with a fractional band width of about 12.5% are obtained.

Assuming the thickness of the piezoelectric layer 2 is d and the distance between the centers of the electrodes of the electrodes 3 and the electrodes 4 is p, d/p is, for example, less than or equal to about 0.5 and preferably less than or equal to about 0.24 in the present preferred embodiment as described above. This will be described with reference to FIG. 22.

Figure 22:
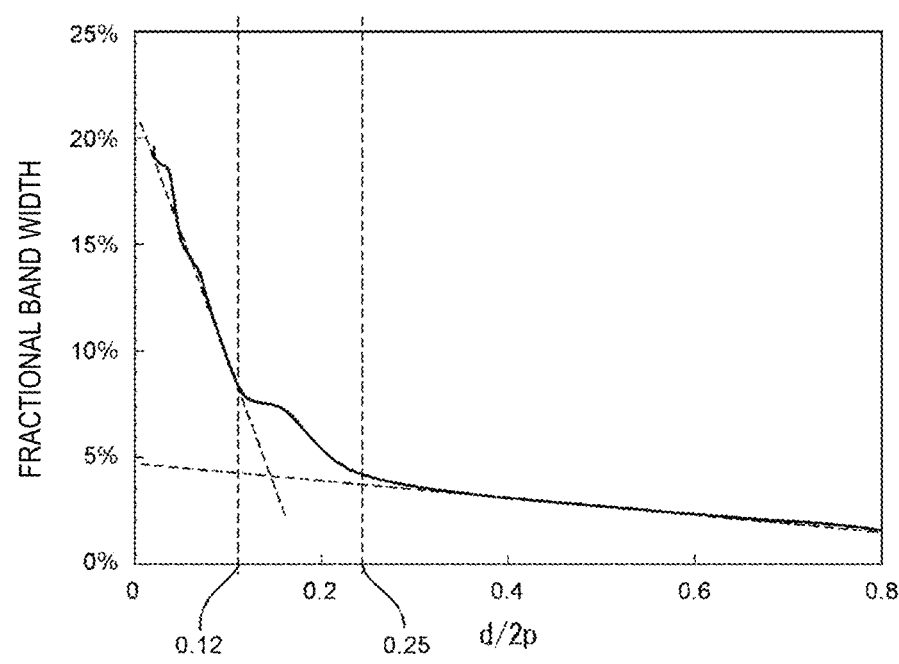
FIG. 22 is a graph that shows the relationship between d/2p and the fractional band width of a resonator where the distance between the centers of adjacent electrodes is p and the thickness of the piezoelectric layer is d.

A plurality of acoustic wave devices is obtained while d/2p is changed as in the case of the acoustic wave device having the resonant characteristics shown in FIG. 21. FIG. 22 is a graph showing the relationship between d/2p and the fractional band width of the acoustic wave device defining and functioning as a resonator.

As is apparent from FIG. 22, when d/2p exceeds about 0.25, that is, d/p>about 0.5, the fractional band width is lower than about 5% even when d/p is adjusted. In contrast, in the case where d/2p≤about 0.25, that is, d/p≤about 0.5, d/p is changed within the range, the fractional band width can be set to about 5% or higher, that is, a resonator having a high coupling coefficient is provided. In the case where d/2p is lower than or equal to about 0.12, that is, d/p is less than or equal to about 0.24, the fractional band width can be increased to about 7% or higher. In addition, when d/p is adjusted within the range, a resonator having a further wide fractional band width is obtained, so a resonator having a further high coupling coefficient is achieved. Therefore, it was discovered that, when d/p is set to about 0.5 or less, a resonator that uses bulk waves in the thickness-shear mode with a high coupling coefficient can be provided.

As described above, in the case of one pair of electrodes, p is defined as the distance between the centers of the adjacent electrodes 3, 4.

For the thickness d of the piezoelectric layer as well, when the piezoelectric layer 2 has thickness variations, an averaged value of the thickness may be used.

Figure 23:
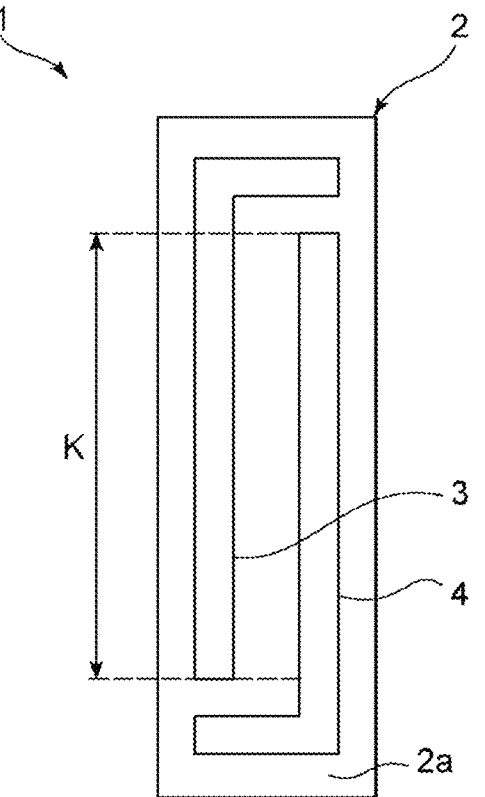
FIG. 23 is a plan view of an acoustic wave device that uses bulk waves in the thickness-shear mode.

FIG. 23 is a plan view of an acoustic wave device that uses bulk waves in the thickness-shear mode. In the acoustic wave device 61, one pair of electrodes including the electrode 3 and the electrode 4 is provided on the first principal surface 2a of the piezoelectric layer 2. In FIG. 23, K is an overlap width. As described above, in the acoustic wave devices of preferred embodiments of the present invention, the number of pairs of electrodes may be one. In this case as well, when d/p is less than or equal to about 0.5, bulk waves in the thickness-shear mode can be effectively excited.

Figure 24:
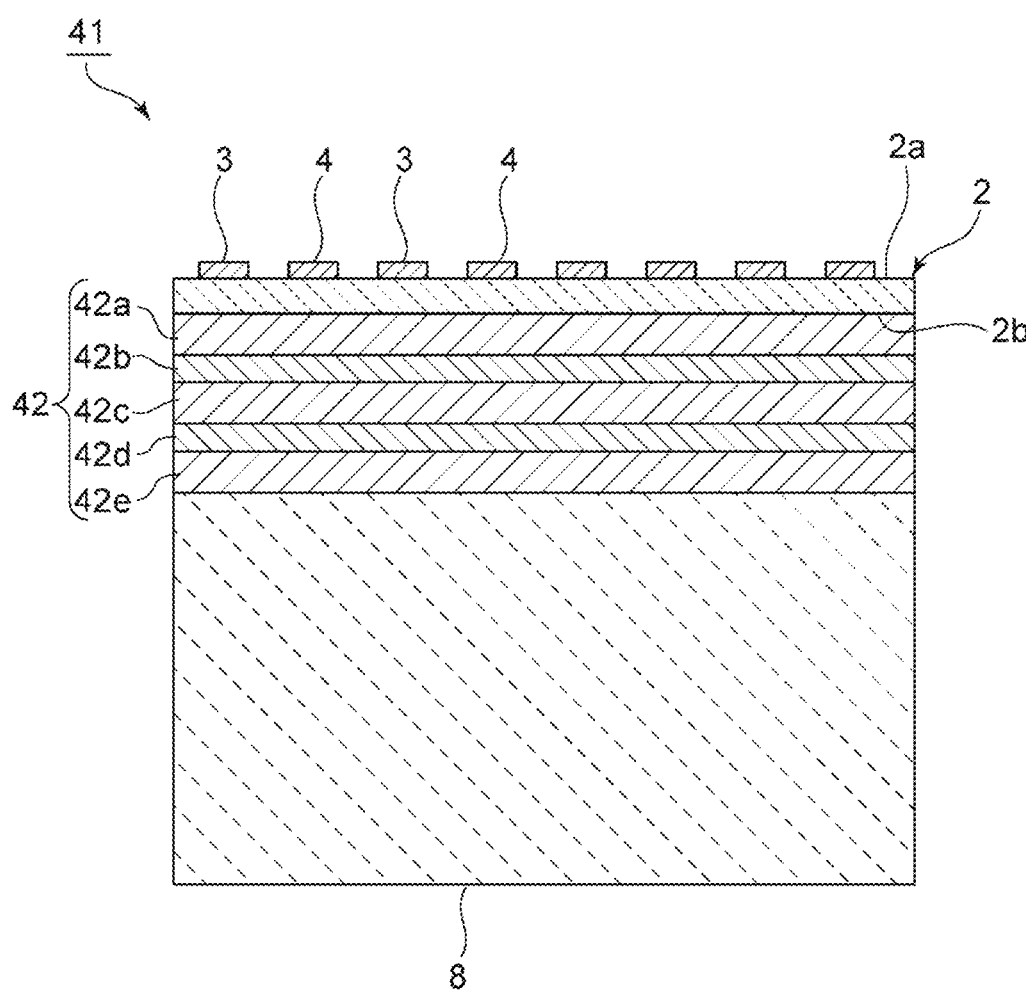
FIG. 24 is an elevational cross-sectional view of an acoustic wave device that uses bulk waves in the thickness-shear mode.

FIG. 24 is an elevational cross-sectional view of an acoustic wave device that uses bulk waves in the thickness-shear mode. In the acoustic wave device 41, an acoustic multilayer film 42 is laminated on the second principal surface 2b of the piezoelectric layer 2. The acoustic multilayer film 42 has a multilayer structure including low acoustic impedance layers 42a, 42c, 42e having a relatively low acoustic impedance and high acoustic impedance layers 42b, 42d having a relatively high acoustic impedance. When the acoustic multilayer film 42 is used, bulk waves in the thickness-shear mode can be enclosed in the piezoelectric layer 2 without using the cavity 9 in the acoustic wave device 1. In this acoustic wave device 41 as well, resonant characteristics based on bulk waves in the thickness-shear mode can be obtained by setting d/p to about 0.5 or less. In the acoustic multilayer film 42, the number of the laminated low acoustic impedance layers 42a, 42c, 42e and the number of the laminated high acoustic impedance layers 42b, 42d are not limited. It is applicable as long as at least one of the high acoustic impedance layers 42b, 42d is located farther from the piezoelectric layer 2 than the low acoustic impedance layers 42a, 42c, 42e.

The low acoustic impedance layers 42a, 42c, 42e and the high acoustic impedance layers 42b, 42d may be made of a material selected as needed as long as the relationship among the acoustic impedance layers is satisfied. Examples of the material of the low acoustic impedance layers 42a, 42c, 42e may include silicon oxide and silicon oxynitride. Examples of the material of the high acoustic impedance layers 42b, 42d may include alumina, silicon nitride, and metals.

As shown in FIG. 2, in the first preferred embodiment, the cavity 13c is provided in the support 13. The cavity 13c is an acoustic reflection portion. With the acoustic reflection portion, bulk waves in the thickness-shear mode are suitably reflected toward the piezoelectric layer 16. As shown in FIG. 24, the acoustic reflection portion may be the acoustic multilayer film 42.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support including a cavity;
   a piezoelectric layer on or above the support and made of one of lithium niobate or lithium tantalate;
   an interdigital transducer electrode embedded in the piezoelectric layer and including surfaces opposed to each other in a thickness direction, one of the surfaces being in contact with the piezoelectric layer; and
   a dielectric film on the piezoelectric layer and covering the interdigital transducer electrode; wherein
   the interdigital transducer electrode includes a plurality of electrode fingers;
   at least one of the plurality of electrode fingers overlaps the cavity in plan view;
   assuming a thickness of the piezoelectric layer is d and an electrode finger pitch of the interdigital transducer electrode is p, p/d≥about 4.25; and
   an entirety of another one of the surfaces of the interdigital transducer electrode is curved at a portion corresponding to at least one of the plurality of electrode fingers.

2. A ladder filter comprising:
   a series arm resonator; and
   a parallel arm resonator; wherein
   the series arm resonator and the parallel arm resonator are each the acoustic wave device according to claim 1; and
   the electrode finger pitch of the interdigital transducer electrode in the series arm resonator is the same or substantially the same as the electrode finger pitch of the interdigital transducer electrode in the parallel arm resonator.

3. The ladder filter according to claim 2, wherein the dielectric film is made of silicon oxide.

4. The ladder filter according to claim 3, wherein a cut angle of the piezoelectric layer is larger than or equal to about 116° Y and smaller than or equal to about 176° Y.

5. The ladder filter according to claim 4, wherein the cut angle of the piezoelectric layer is larger than or equal to about 142°Y and smaller than or equal to about 156° Y.

6. The ladder filter according to claim 3, wherein
about $6.25 \leq p/d \leq$ about 7.0; and
    a width of each of the plurality of electrode fingers of the
        interdigital transducer electrode is greater than or equal
        to about 0.7 $\mu$m and less than or equal to about 1.15 $\mu$m.

7. The ladder filter according to claim 2, wherein a thickness of the dielectric film in the series arm resonator is different from a thickness of the dielectric film in the parallel arm resonator.

8. The ladder filter according to claim 2, wherein the piezoelectric layer is made of lithium niobate.

9. The ladder filter according to claim 2, wherein about $5.75 \leq p/d \leq$ about 6.5.

10. The ladder filter according to claim 2, wherein a cross sectional area of each of the plurality of electrode fingers of the interdigital transducer electrode is greater than or equal to about 0.0475 $\mu$m$^2$ and less than or equal to about 0.0525 $\mu$m$^2$.

11. The acoustic wave device according to claim 1, wherein the dielectric film is made of silicon oxide.

12. The acoustic wave device according to claim 11, wherein a cut angle of the piezoelectric layer is larger than or equal to about 116°Y and smaller than or equal to about 176° Y.

13. The acoustic wave device according to claim 12, wherein the cut angle of the piezoelectric layer is larger than or equal to about 142°Y and smaller than or equal to about 156° Y.

14. The acoustic wave device according to claim 11, wherein
about $6.25 \leq p/d \leq$ about 7.0; and
    a width of each of the plurality of electrode fingers of the
        interdigital transducer electrode is greater than or equal
        to about 0.7 $\mu$m and less than or equal to about 1.15 $\mu$m.

15. The acoustic wave device according to claim 1, wherein the piezoelectric layer is made of lithium niobate.

16. The acoustic wave device according to claim 1, wherein about $5.75 \leq p/d \leq$ about 6.5.

17. The acoustic wave device according to claim 1, wherein a cross sectional area of each of the plurality of electrode fingers of the interdigital transducer electrode is greater than or equal to about 0.0475 $\mu$m$^2$ and less than or equal to about 0.0525 $\mu$m$^2$.

18. A ladder filter comprising:
a series arm resonator; and
a parallel arm resonator, wherein
the parallel arm resonator is the acoustic wave device according to claim 1.

19. An acoustic wave device comprising:
a support;
a piezoelectric layer on or above the support and made of
    one of lithium niobate or lithium tantalate;
an interdigital transducer electrode embedded in the
    piezoelectric layer and including surfaces opposed to
    each other in a thickness direction, one of the surfaces
    being in contact with the piezoelectric layer; and
a dielectric film on the piezoelectric layer and covering
    the interdigital transducer electrode; wherein
the piezoelectric layer includes a cavity;
the interdigital transducer electrode includes a plurality of
    electrode fingers;
at least one of the plurality of electrode fingers overlaps
    the cavity in plan view;
assuming a thickness of the piezoelectric layer is d and an
    electrode finger pitch of the interdigital transducer
    electrode is p, $p/d \geq$ about 4.25;
another one of the surfaces of the interdigital transducer
    electrode has a recessed shape at a portion correspond-
    ing to at least one of the plurality of electrode fingers;
    and
an entirety of the another one of the surfaces of the
    interdigital transducer electrode is curved at the portion
    corresponding to the at least one of the plurality of
    electrode fingers.

20. The acoustic wave device according to claim 19, wherein the dielectric film is made of silicon oxide.

\* \* \* \* \*